United States Patent
Li et al.

(10) Patent No.: US 12,180,062 B2
(45) Date of Patent: Dec. 31, 2024

(54) MICROELECTROMECHANICAL APPARATUS HAVING MULTIPLE VIBRATING PORTIONS

(71) Applicant: INDUSTRIAL TECHNOLOGY RESEARCH INSTITUTE, Hsinchu (TW)

(72) Inventors: Jen-Chieh Li, Tainan (TW); Chao-Ta Huang, Hsinchu (TW); Chung-Yuan Su, Tainan (TW); RueiHung Kao, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 196 days.

(21) Appl. No.: 17/743,331

(22) Filed: May 12, 2022

(65) Prior Publication Data
US 2023/0202832 A1    Jun. 29, 2023

(30) Foreign Application Priority Data
Dec. 29, 2021    (TW) .................................. 110149435

(51) Int. Cl.
*B81B 3/00*    (2006.01)
*H01L 41/04*   (2006.01)
(Continued)

(52) U.S. Cl.
CPC ............ *B81B 3/0021* (2013.01); *H04R 17/00* (2013.01); *H04R 19/02* (2013.01); *H10N 30/802* (2023.02); *B81B 2201/0257* (2013.01)

(58) Field of Classification Search
CPC .......... B81B 3/0021; B81B 2201/0257; H10N 30/802; H04R 17/00; H04R 19/02; H04R 7/06
See application file for complete search history.

(56) References Cited

U.S. PATENT DOCUMENTS

| 9,454,954 B2 | 9/2016 | Hajati |
| 9,980,051 B2 | 5/2018 | Clerici |
(Continued)

FOREIGN PATENT DOCUMENTS

| CN | 106416295 A | 2/2017 |
| CN | 106488366 A | 3/2017 |
(Continued)

OTHER PUBLICATIONS

English machine translation of CN 11147998 (Luo et al.; MEMS micro loudspeaker, preparation method thereof and electronic equipment; published May 2020) (Year: 2020).*

(Continued)

*Primary Examiner* — Mark Fischer
(74) *Attorney, Agent, or Firm* — Maschoff Brennan

(57) ABSTRACT

A microelectromechanical apparatus includes a base and a thin film including a stationary part disposed on the base, a peripheral part, a central part surrounded by the peripheral part, and a first and second elastic part. The first elastic part is connected to the stationary part and the peripheral part. The second elastic part is connected to the peripheral part and the central part. When low frequency signal is input to a first electrode of the first elastic part, the peripheral part and the and the central part respectively vibrate with a first and second low-frequency amplitudes. When high-frequency signal is input to a second electrode of the second elastic part, the peripheral part and the central part respectively vibrate with a first and second high-frequency amplitudes. A difference between the first and second low-frequency amplitudes is smaller than a difference between the first and second high-frequency amplitudes.

32 Claims, 18 Drawing Sheets

(51) Int. Cl.
*H04R 17/00* (2006.01)
*H04R 19/02* (2006.01)
*H10N 30/80* (2023.01)

(56) References Cited

U.S. PATENT DOCUMENTS

| | | |
|---|---|---|
| 9,986,343 B2 | 5/2018 | Haber |
| 10,405,101 B2 | 9/2019 | Rusconi |
| 10,483,876 B2 | 11/2019 | Langa |
| 10,516,948 B2 | 12/2019 | Rusconi |
| 10,522,733 B2 | 12/2019 | Kaplan |
| 10,567,866 B1 | 2/2020 | Liang |
| 10,623,882 B1 | 4/2020 | Liang |
| 10,642,240 B2 | 5/2020 | Lewin |
| 2012/0076330 A1 | 3/2012 | Cohen |
| 2014/0084394 A1* | 3/2014 | Je ............... B81B 3/0018 257/416 |
| 2018/0098139 A1 | 4/2018 | Arevalo |
| 2019/0238974 A1 | 8/2019 | Hong |
| 2020/0045425 A1 | 2/2020 | Rusconi |
| 2020/0100033 A1 | 3/2020 | Stoppel |
| 2020/0221238 A1 | 7/2020 | Bottoni |

FOREIGN PATENT DOCUMENTS

| | | |
|---|---|---|
| CN | 106688245 B | 5/2017 |
| CN | 106797510 A | 5/2017 |
| CN | 107124684 A | 9/2017 |
| CN | 110351636 A | 10/2019 |
| CN | 110785374 A | 2/2020 |
| CN | 111147998 A | 5/2020 |
| CN | 112637748 A | 4/2021 |
| TW | M499720 U | 4/2015 |
| TW | 201830982 A | 8/2018 |
| TW | 201840208 A | 11/2018 |
| TW | 202137782 A | 10/2021 |

OTHER PUBLICATIONS

Wang et al., "A high-SPL piezoelectric MEMS loud speaker based on thin ceramic PZT" 2020.
Kim et al., "Improvement of Low-Frequency Characteristics of Piezoelectric Speakers Based on Acoustic Diaphragms", Sep. 2012.
Stoppel et al., "New Integrated Full-Range MEMS Speaker for In-Ear Applications" 2018.
Taiwan Office Action dated Oct. 31, 2022 as received in application No. 110149435.

* cited by examiner

MICROELECTROMECHANICAL APPARATUS HAVING MULTIPLE VIBRATING PORTIONS

CROSS-REFERENCE TO RELATED APPLICATIONS

This non-provisional application claims priority under 35 U.S.C. § 119(a) on Patent Application No(s). 110149435 filed in Taiwan, R.O.C. on Dec. 29, 2021, the entire contents of which are hereby incorporated by reference.

TECHNICAL FIELD

The disclosure relates to a microelectromechanical apparatus, and relates to a microelectromechanical apparatus having multiple vibrating portions.

BACKGROUND

Conventionally, a micro speaker (e.g., earphones) produces sound wave using a voice coil motor vibrating air.

However, single voice coil motor produces a sufficient sound pressure usually only in a specific range of frequency. Therefore, single voice coil motor is unable to meet the requirements of both high-frequency sound and low-frequency sound. Also, a typical voice coil motor is constituted of an assembly of various components and thus it involves a complex manufacturing process. In addition, it is difficult to reduce the size of the typical voice coil motor and therefore is not applicable for the trend of minimization of electronic products (e.g., Bluetooth earphones). Moreover, the typical voice coil motor experiences many times of energy transformation during operation, thereby resulting in excessive power consumption.

SUMMARY

One embodiment of the disclosure provides a microelectromechanical apparatus having multiple vibrating portions. The microelectromechanical apparatus includes a base and a thin film. The thin film includes a stationary part, a peripheral part, a central part, at least one first elastic part, and at least one second elastic part. The stationary part is disposed on the base. The peripheral part surrounds the central part. The first elastic part includes at least one first electrode. The second elastic part includes at least one second electrode. The first elastic part is connected to the stationary part and the peripheral part, and the second elastic part is connected to the peripheral part and the central part. When a low frequency electrical driving signal is input to the first electrode, the peripheral part vibrates with a first low-frequency amplitude along an axial direction, and the central part vibrates with a second low-frequency amplitude along the axial direction, and the axial direction is parallel to a normal vector of the base. When a high-frequency electrical driving signal is input to the second electrode, the peripheral part vibrates with a first high-frequency amplitude along the axial direction, and the central part vibrates with a second high-frequency amplitude along the axial direction. A difference between the first low-frequency amplitude and the second low-frequency amplitude is smaller than a difference between the first high-frequency amplitude and the second high-frequency amplitude.

Another embodiment of the disclosure provides a microelectromechanical apparatus having multiple vibrating portions. The microelectromechanical apparatus includes a base and a thin film. The thin film includes a stationary part, a peripheral part, a central part, at least one first elastic part, and at least on second elastic part. The stationary part is disposed on the base. The peripheral part surrounds the central part. The first elastic part includes at least one first electrode, at least one first piezoelectric material layer, a first outer connection portion, and a first inner connection portion. The first electrode is electrically connected to the first piezoelectric material layer. The first elastic part surrounds the peripheral part, the first outer connection portion is connected to the stationary part, and the first inner connection portion is connected to the peripheral part. The second elastic part includes at least one second electrode, at least one second piezoelectric material layer, a second outer connection portion, and a second inner connection portion. The second electrode is electrically connected to the second piezoelectric material layer. The second elastic part surrounds the central part, the second outer connection portion is connected to the peripheral part, and the second inner connection portion is connected to the central part.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
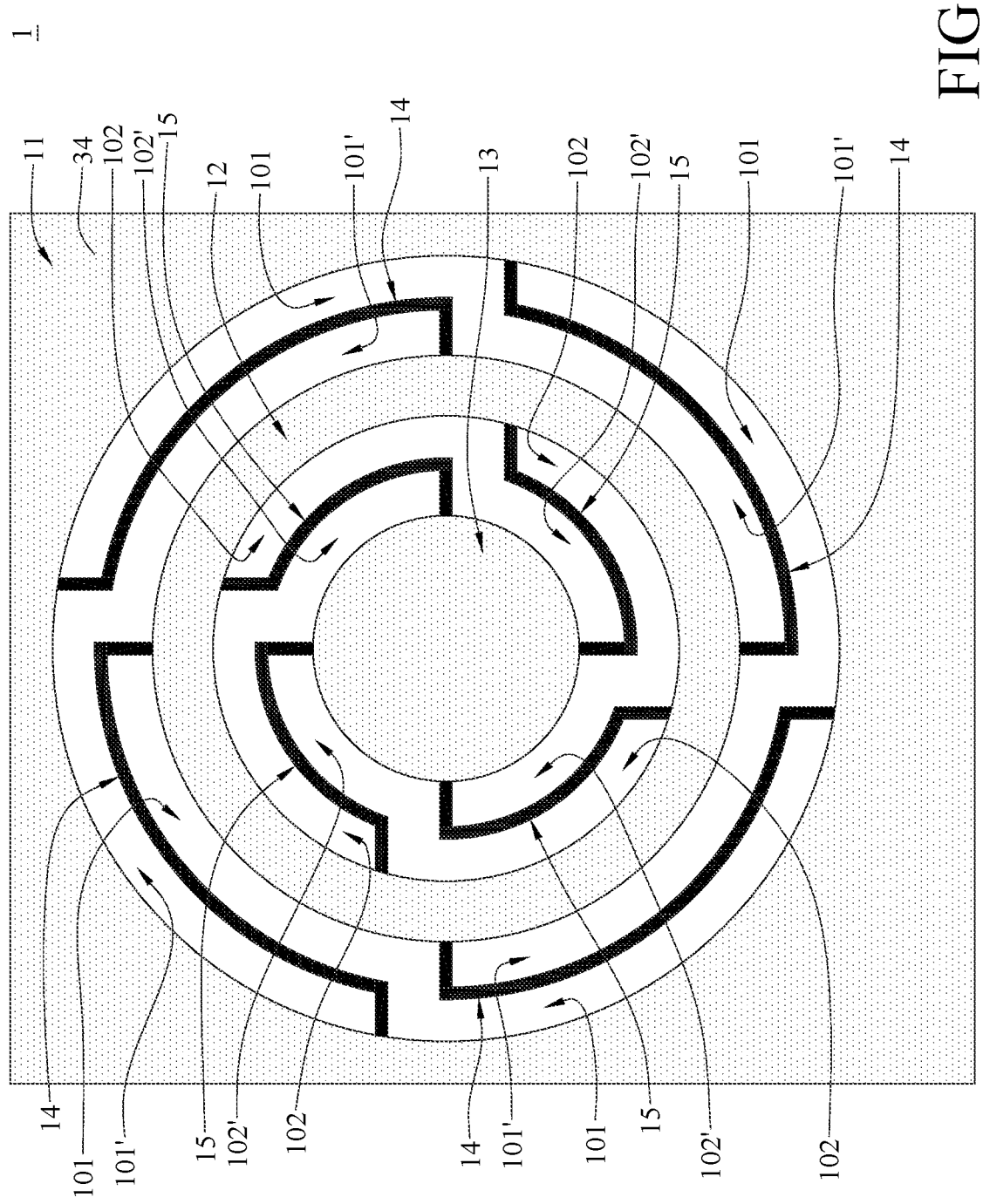
FIG. 1 is a simplified top view of a microelectromechanical apparatus having multiple vibrating portions according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
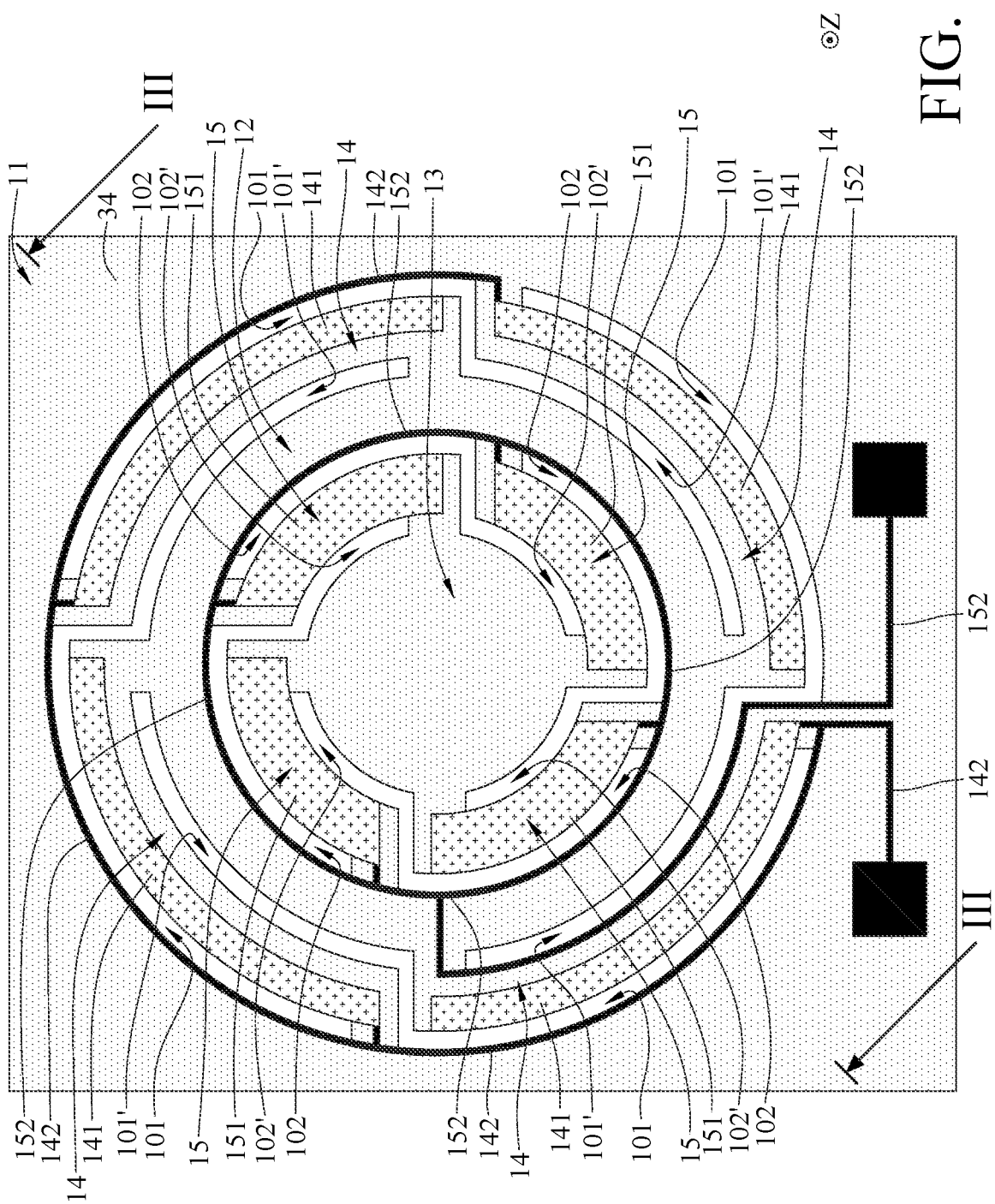
FIG. 2 is a specified top view of the microelectromechanical apparatus in FIG. 1.
Figure 3:
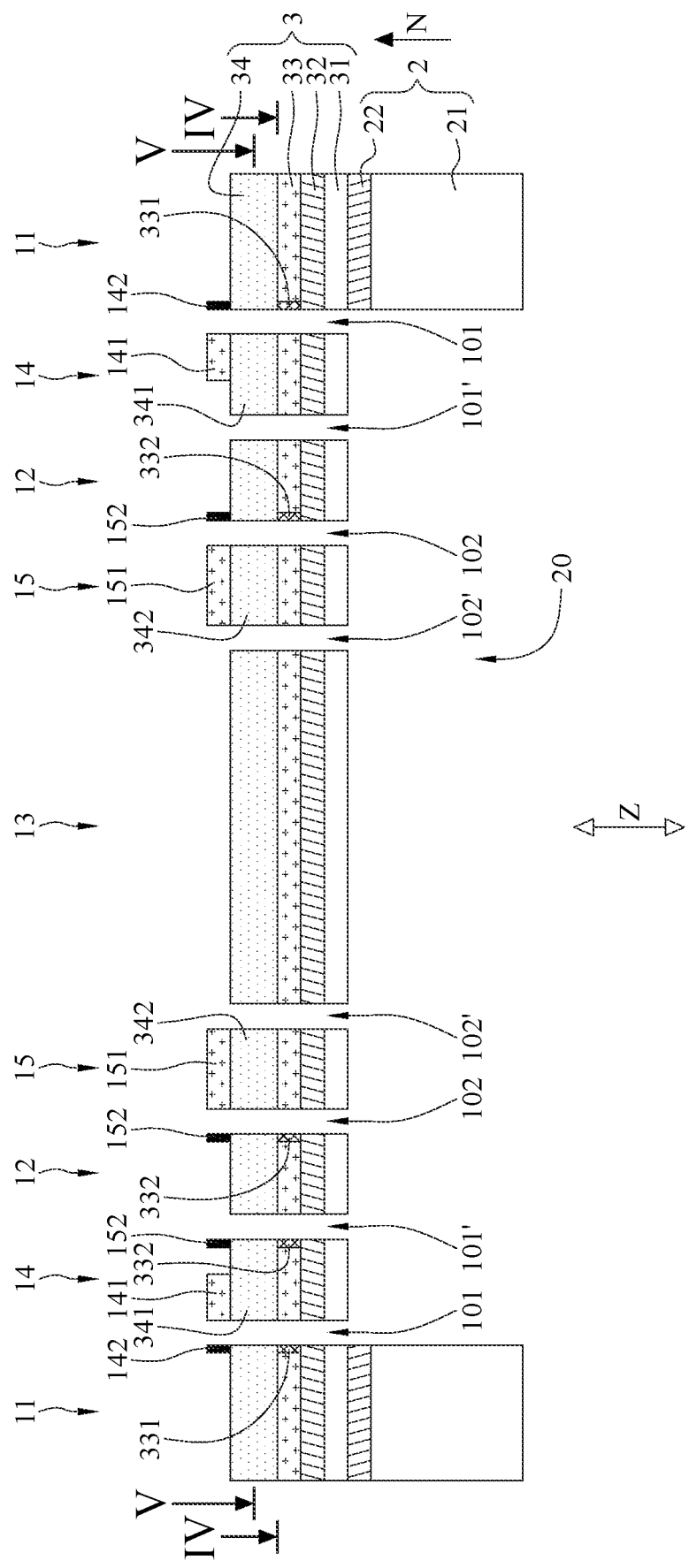
FIG. 3 is a cross-sectional view of the microelectromechanical apparatus in FIG. 1 taken along a line III-III.

Referring to FIGS. 1, 2, and 3, where FIG. 1 is a simplified top view of a microelectromechanical apparatus having multiple vibrating portions according to one embodiment of the disclosure, FIG. 2 is a specified top view of the microelectromechanical apparatus in FIG. 1, and FIG. 3 is a cross-sectional view of the microelectromechanical apparatus in FIG. 1 taken along a line III-III.

As shown in FIGS. 1, 2, and 3, the microelectromechanical apparatus 1 having multiple vibrating portions includes a base 2, a thin film 3, a first electrically conductive line 142, and a second electrically conductive line 152. The base 2 includes a base layer 21 and an insulation layer 22 disposed on the base layer 21. The thin film 3 is disposed on the insulation layer 22. The base 2 has a cavity 20. After the base 2 and the thin film 3 are bonded to each other, the cavity 20 is formed by the holes penetrating through the base layer 21 and the insulation layer 22. The thin film 3 includes the base layer 31, the insulation layer 32, a common electrode layer 33, and a piezoelectric material layer 34. The thin film 3 includes a stationary part 11, a peripheral part 12, a central part 13, a plurality of first elastic parts 14, and a plurality of second elastic parts 15. As shown in FIG. 2 and FIG. 3, the quantity of the first elastic parts 14 and the quantity of the second elastic parts 15 are not restricted to be four and may be modified to another number. The quantity of the first elastic parts 14 and the quantity of the second elastic parts 15 may be the same or different from each other.

The stationary part 11 is disposed on the base 2. The stationary part 11 surrounds the peripheral part 12. A first slot 101, the first elastic part 14, and another first slot 101' are located between the stationary part 11 and the peripheral part 12. The stationary part 11 and part of each of the first elastic parts 14 are separated from each other by the first slot 101. The peripheral part 12 and part of each of the first elastic parts 14 are separated from each other by the another first slot 101'. Part of each of the first elastic part 14 is located between the first slot 101 and the another first slot 101' while each of the first elastic parts 14 is connected to the stationary part 11 and the peripheral part 12. The peripheral part 12 surrounds the central part 13. A second slot 102, the second elastic part 15, and another second slot 102' are located between the peripheral part 12 and the central part 13. The peripheral part 12 and part of each of the second elastic parts 15 are separated from each other by the second slot 102. The central part 13 and part of each of the second elastic parts 15 are separated from each other by another second slot 102'. Part of each of the second elastic parts 15 is located between the second slot 102 and the another second slot 102' while each of the second elastic parts 15 is connected to the peripheral part 12 and the central part 13. In this embodiment, the stiffness (K2) of the second elastic part 15 along the axial direction Z is greater than the stiffness (K1) of the first elastic part 14 along the axial direction Z, where the axial direction Z is parallel to a normal vector N of the base 2. In this embodiment, a stiffness ratio (K2/K1) of the stiffness (K2) of the second elastic part 15 along the axial direction Z to the stiffness (K1) of the first elastic part 14 along the axial direction Z is greater than a predetermined stiffness ratio. In this embodiment, the predetermined stiffness ratio is approximately 4.6. In some other embodiments, the predetermined stiffness ratio may be greater than or approximately equal to 3.0. In another aspect, the stiffness of the each of the first elastic parts 14 along the axial direction Z is smaller than the stiffness of each of the second elastic parts 15 along the axial direction Z. A main portion of each of the first elastic parts 14 is in a curved shape surrounding the peripheral part 12. One end of each of the first elastic parts 14 is bent towards the stationary part 11 and connected to the stationary part 11, and another end of the each of the first elastic parts 14 is bent towards the peripheral part 12 and connected to the peripheral part 12. A main portion of each of the second elastic parts 15 is in a curved shape surrounding the central part 13. One end of each of the second elastic parts 15 is bent towards the peripheral part 12 and connected to the peripheral part 12, and another end thereof is bent towards the central part 13 and connected to the central part 13, but the present disclosure is not limited thereto; in some other embodiments, each of the first elastic parts 14 and each of the second elastic parts 15 may be in another shape.

In this embodiment, a length of each of the first elastic parts 14 is greater than a length of each of the second elastic parts 15, such that a stiffness of each of the first elastic parts 14 along the axial direction Z is smaller than a stiffness of each of the second elastic parts 15 along the axial direction Z. In one embodiment, the aforementioned stiffness indicates the stiffness of each elastic part. An equivalent stiffness of the multiple first elastic parts 14 can be calculated from the equivalent stiffness of the first elastic parts 14 which are connected in parallel. And an equivalent stiffness of the multiple second elastic parts 15 can be calculated from the equivalent stiffness of the multiple second elastic parts 15 which are connected in parallel. That is, the aforementioned equivalent stiffness is derived from the equivalent stiffness of the multiple elastic parts which are connected in parallel. Since the quantity of the first elastic parts 14 and the quantity of the second elastic parts 15 are equal to each other, the equivalent stiffness of the first elastic parts 14 is also smaller than the equivalent stiffness of the second elastic parts 15, but the present disclosure is not limited thereto. In some other embodiments, the thickness of each of the first elastic parts 14 is smaller than the thickness of each of the second elastic parts 15, such that the stiffness of each of the first elastic parts 14 along the axial direction Z is smaller than the stiffness of each of the second elastic parts 15 along the axial direction Z. In another embodiment, a width of each of the first elastic parts 14 is smaller than a width of each of the second elastic parts 15, such that the stiffness of each of the first elastic parts 14 along the axial direction Z is smaller than the stiffness of each of the second elastic parts 15 along the axial direction Z. In still another embodiment, the quantity of the first elastic parts 14 is smaller than the quantity of the second elastic parts 15, such that the equivalent stiffness of the multiple first elastic parts 14 along the axial direction Z is smaller than the equivalent stiffness of the multiple second elastic parts 15 along the axial direction Z. The first elastic parts 14 are arranged to be a ring shape surrounding the peripheral part 12. The first elastic parts 14 can be twisted and deformed so as to cause the peripheral part 12 to move upwards or downwards along the axial direction Z. The plurality of second elastic parts 15 are arranged to be a ring shape surrounding the central part 13. The second elastic parts 15 can be twisted and deformed so as to cause the central part 13 to move upwards or downwards along the axial direction Z.

Figure 11:
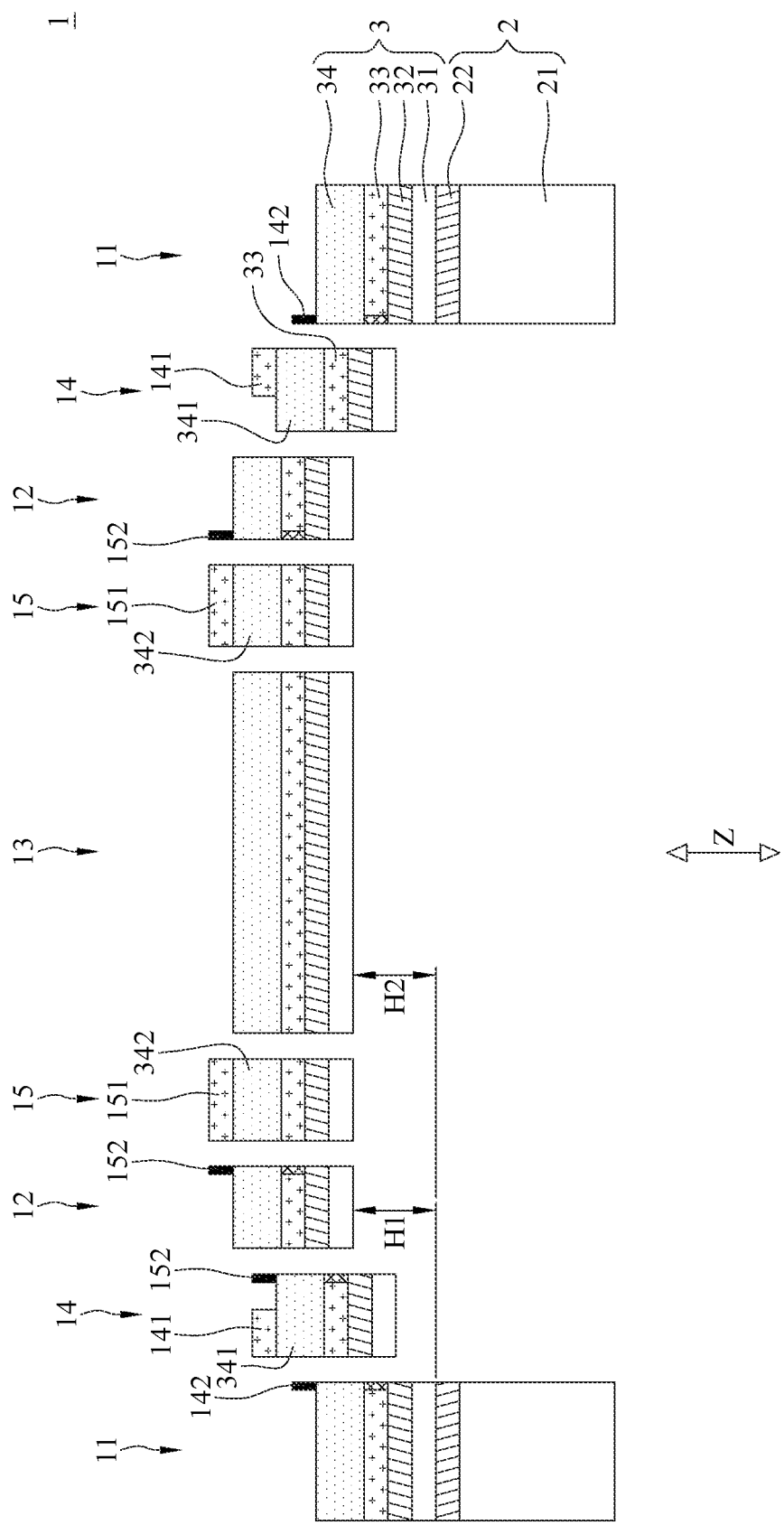
FIGS. 11 and 12 are lateral cross-sectional views showing the operation of the microelectromechanical apparatus in FIG. 3.

The stiffness or the equivalent stiffness of the first elastic parts 14 along the axial direction Z is smaller than the stiffness or the equivalent stiffness of the second elastic parts 15 along the axial direction Z. Therefore, when a low frequency electrical driving signal is input to a first electrode 141, the peripheral part 12 vibrates with a first low-frequency amplitude H1 (as shown in FIG. 11) in the axial direction Z, and the central part 13 vibrates with a second low-frequency amplitude H2 (as shown in FIG. 11) in the axial direction Z. The difference between the first low-frequency amplitude H1 and the second low-frequency amplitude H2 is smaller than a predetermined low-frequency amplitude value. Furthermore, when the stiffness or the equivalent stiffness of the first elastic parts 14 along the axial direction Z is smaller than the stiffness or the equivalent stiffness of the second elastic parts 15 along the axial direction Z, and the low frequency electrical driving signal is input to the first electrode 141, the value of the first low-frequency amplitude H1 may approach the value of the second low-frequency amplitude H2; in this case, the peripheral part 12 and the central part 13 can be considered to perform a low-frequency vibration together.

As shown in FIG. 2, the thin film 3 includes the stationary part 11, the peripheral part 12, the central part 13, the first elastic parts 14, and the second elastic parts 15. Each of the aforementioned stationary part 11, peripheral part 12, central part 13, first elastic parts 14, and second elastic parts 15 of the thin film 3 includes the base layer 31, the insulation layer 32, the common electrode layer 33, and the piezoelectric material layer 34. As shown in FIG. 3, the piezoelectric material layer 34 located at each of the first elastic parts 14 can be served as a first piezoelectric material layer 341, and each of the first elastic parts 14 further includes the first electrode 141 disposed on the first piezoelectric material layer 341. The piezoelectric material layer 34 located at each of the second elastic parts 15 can be served as a second piezoelectric material layer 342, and each of the second elastic parts 15 further includes a second electrode 151 disposed on the second piezoelectric material layer 342. The first electrically conductive line 142 is disposed on the piezoelectric material layer 34 of the stationary part 11. A width of the first electrically conductive line 142 is smaller than a width of the first electrode 141. As shown in FIG. 2 and FIG. 3, the left portion of FIG. 3 shows that the second electrically conductive line 152 is disposed on the first piezoelectric material layer 341 of one of the first elastic parts 14 and the piezoelectric material layer 34 of the peripheral part 12. The right portion of FIG. 3 shows that the second electrically conductive line 152 is disposed on the piezoelectric material layer 34 of the peripheral part 12. A width of the second electrically conductive line 152 is smaller than a width of the second electrode 151. Since the width of the first electrically conductive line 142 is smaller than the width of the first electrode 141, thus, when a current passes through the first electrically conductive line 142, the piezoelectric material layer 34 of the stationary part 11 could not cause large deformation. It prevents the stationary part 11 in which the first electrically conductive line 142 passes through from being unexpectedly deformed. Similarly, since the width of the second electrically conductive line 152 is smaller than the width of the second electrode 151, thus, when a current passes through the second electrically conductive line 152, the first piezoelectric material layer 341 of the first elastic part 14 and the piezoelectric material layer 34 of the peripheral part 12 could not cause large deformation. It prevents the peripheral part 12 or the first elastic part 14 in which the second electrically conductive line 152 is passes through from being unexpectedly deformed.

Figure 4:
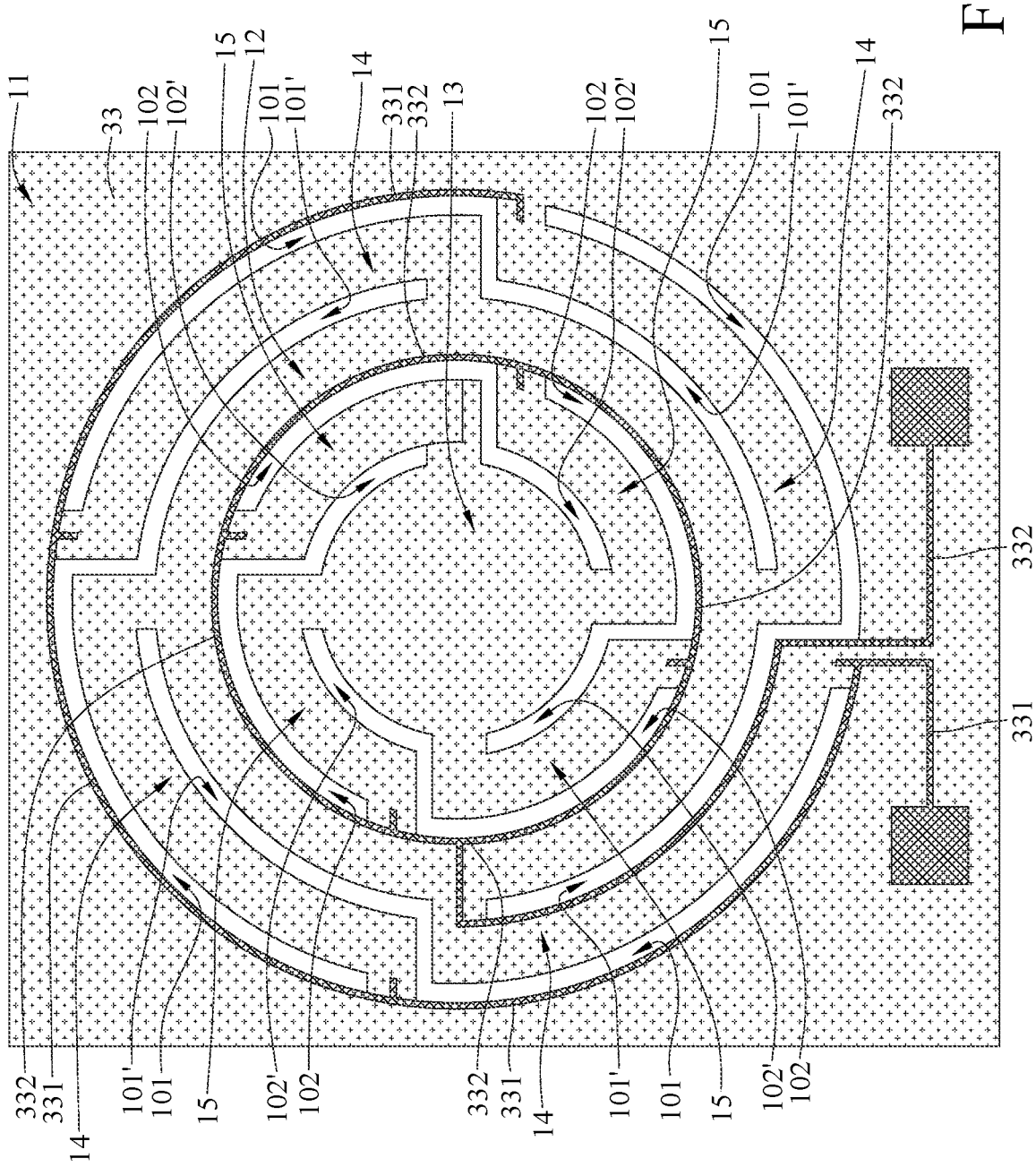
FIG. 4 is a cross-sectional view of the microelectromechanical apparatus in FIG. 3 taken along a line IV-IV.
Figure 5:
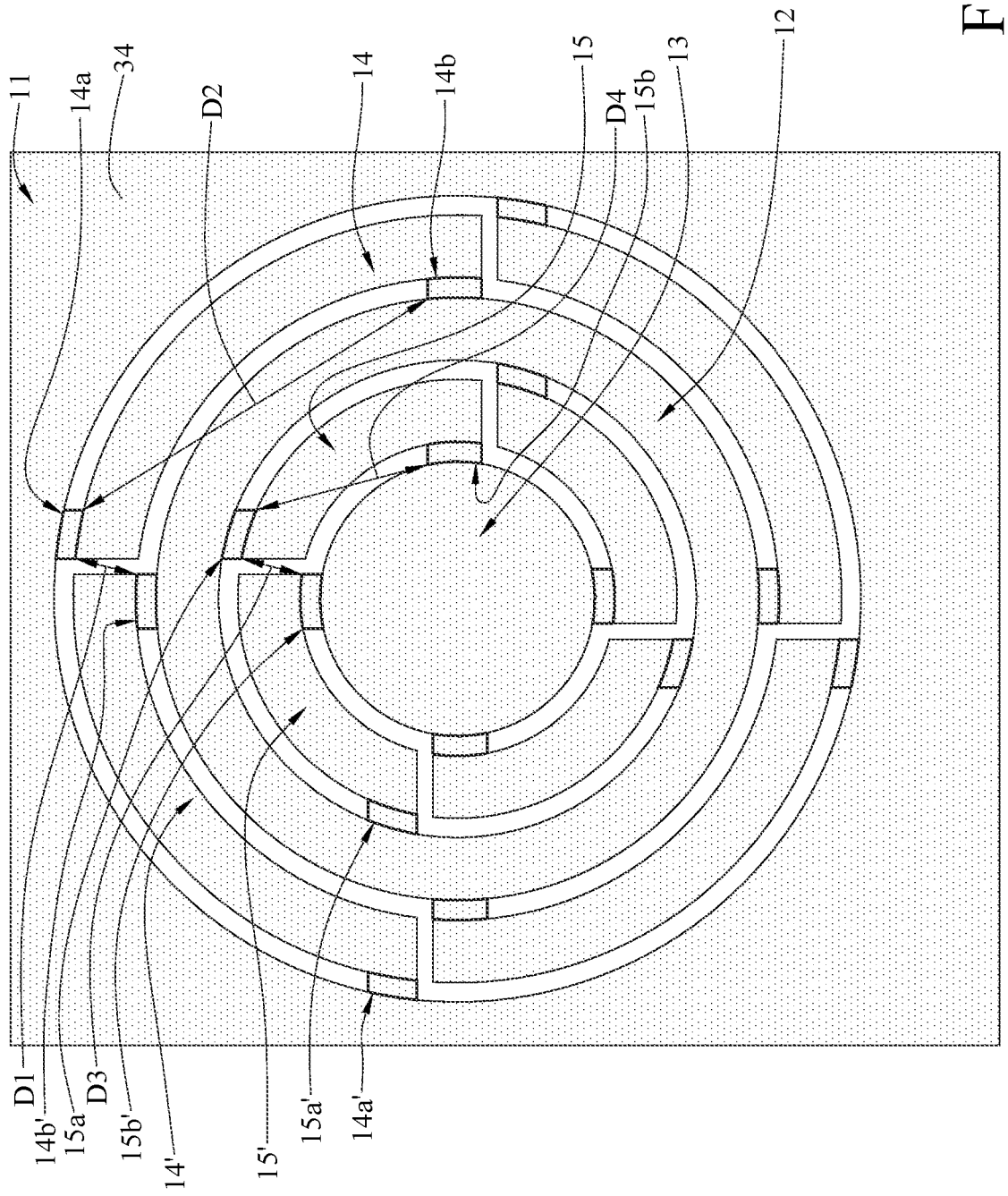
FIG. 5 is a cross-sectional view of the microelectromechanical apparatus in FIG. 3 taken along a line V-V.
Figure 6:
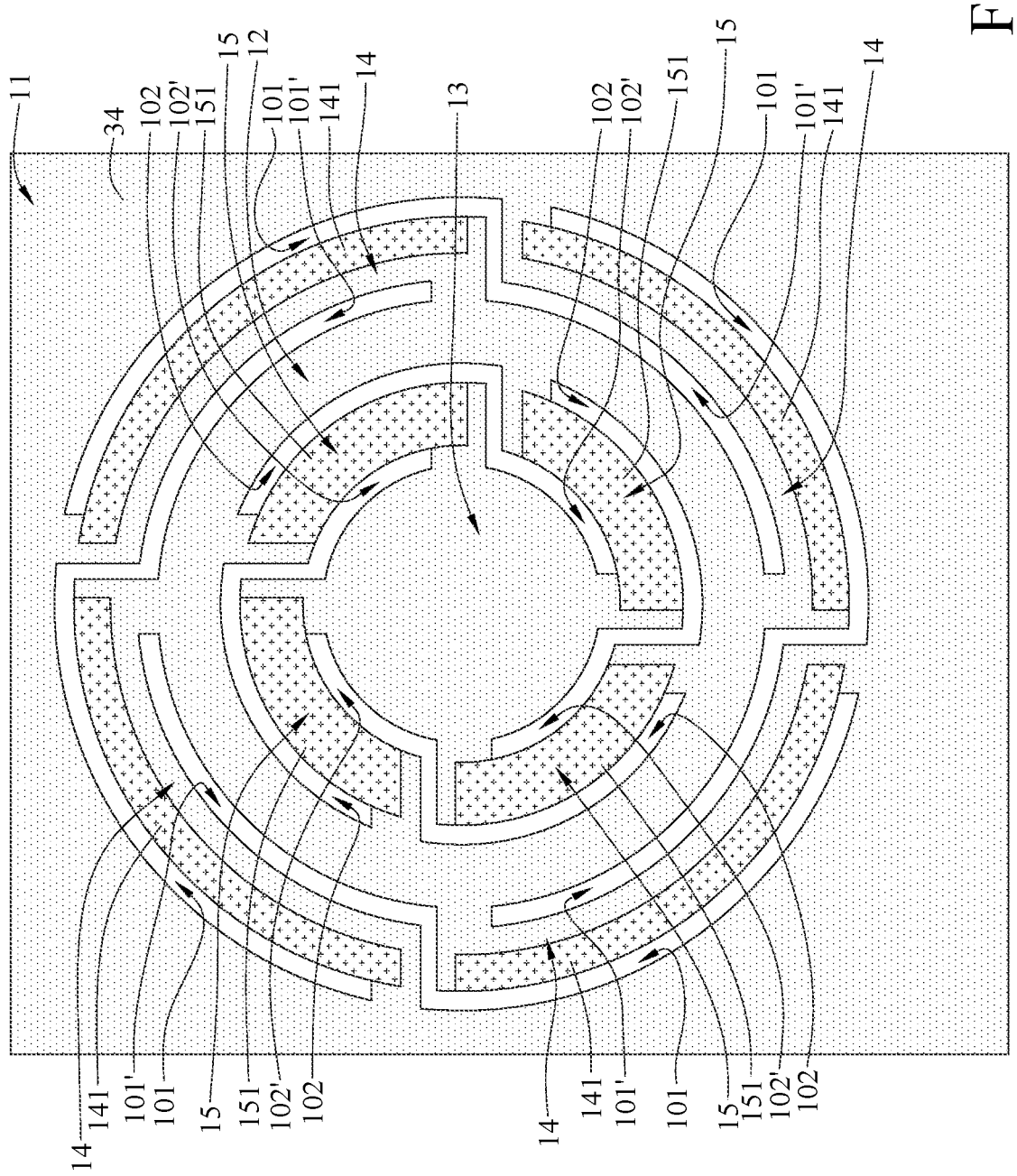
FIG. 6 is a partial top view of the microelectromechanical apparatus in FIG. 2.

Referring to FIGS. 2 to 6, where FIG. 4 is a cross-sectional view of the microelectromechanical apparatus in FIG. 3 taken along a line IV-IV, FIG. 5 is a cross-sectional view of the microelectromechanical apparatus in FIG. 3 taken along a line V-V, and FIG. 6 is a partial top view of the microelectromechanical apparatus in FIG. 2.

As shown in FIG. 3 and FIG. 4, a first insulation line 331 is disposed at where the first electrically conductive line 142 projects onto the common electrode layer 33. The first insulation line 331 is disposed through the common electrode layer 33, such that a portion of the piezoelectric material layer 34 is located between the first electrically conductive line 142 and the first insulation line 331. Therefore, an electrical field passing through the piezoelectric material layer 34 is uneasily produced between the first electrically conductive line 142 and the first insulation line 331. A second insulation line 332 is disposed at where the second electrically conductive line 152 projects onto the common electrode layer 33. The second insulation line 332 is disposed through the common electrode layer 33, such that another portion of the piezoelectric material layer 34 is located between the second electrically conductive line 152 and the second insulation line 332. Therefore, an electrical field passing through the piezoelectric material layer 34 is uneasily produced between the second electrically conductive line 152 and the second insulation line 332. When an electrical signal passes through the first electrically conductive line 142 and the common electrode layer 33, the piezoelectric material layer 34 disposed between the first electrically conductive line 142 and the first insulation line 331 is not deformed since there is no electrical field generated thereon. Similarly, when an electrical signal passes through the second electrically conductive line 152 and the common electrode layer 33, the piezoelectric material layer 34 disposed between the second electrically conductive line 152 and the second insulation line 332 is not deformed since there is no electrical field generated thereon.

Referring to FIGS. 3 and 5, where FIG. 5 is a cross-sectional view of the microelectromechanical apparatus having multiple vibrating portions in FIG. 3 taken along the line V-V. The structures shown in the top view of FIG. 5 are the structures of the piezoelectric material layer 34. Hereinafter, the structures and shapes of the first elastic parts 14 and the second elastic parts 15 and the connection between them in the top view are illustrated via the piezoelectric material layer 34.

As shown in FIGS. 2 and 5, the first elastic part 14 further includes a first outer connection portion 14a (indicated by bold solid lines shown in FIG. 5) and a first inner connection portion 14b (indicated by bold solid lines shown in FIG. 5). The first elastic part 14 surrounds the peripheral part 12. The first outer connection portion 14a is connected to the stationary part 11, and the first inner connection portion 14b is connected to the peripheral part 12. The second elastic part 15 further includes a second outer connection portion 15a (indicated by bold solid lines shown in FIG. 5) and a second inner connection portion 15b (indicated by bold solid lines shown in FIG. 5). The second elastic part 15 surrounds the central part 13. The second outer connection portion 15a is connected to the peripheral part 12, and the second inner connection portion 15b is connected to the central part 13.

For ease of explanation, another first elastic part denotes to "14'". The first elastic part 14' further includes a first outer connection portion 14a' (indicated by bold solid lines shown in FIG. 5) and a first inner connection portion 14b' (indicated by bold solid lines shown in FIG. 5). The minimum distance from the first outer connection portion 14a of the first elastic part 14 to the first inner connection portion 14b' of the another first elastic part 14' denotes to "D1". The minimum distance between the first outer connection portion 14a of the first elastic part 14 to the first inner connection portion 14b of the first elastic part 14 denotes to "D2". In this embodiment, D1 is smaller than D2. In other words, the first outer connection portion 14a of the first elastic part 14 is located closer to the first inner connection portion 14b' of the another first elastic part 14'. Therefore, the first elastic part 14 can not only be connected to the stationary part 11 and the peripheral part 12, but also the first elastic part 14 have a sufficient length to have a stiffness along the axial direction Z smaller than that of the second elastic part 15 while the first elastic part 14 surrounds the peripheral part 12.

On the other hand, for ease of explanation, another second elastic part denotes to "15'". The second elastic part 15' further includes a second outer connection portion 15a' (indicated by bold solid lines shown in FIG. 5) and a second inner connection portion 15b' ((indicated by bold solid lines shown in FIG. 5). The minimum distance from the second outer connection portion 15a of the second elastic part 15 to the second inner connection portion 15b' of the another second elastic part 15' denotes to "D3". The minimum distance from the second inner connection portion 15b of the second elastic part 15 to the second outer connection portion 15a of the second elastic part 15 denotes to "D4". In this embodiment, D3 is smaller than D4. In other words, the second outer connection portion 15a of the second elastic part 15 is located closer to the second inner connection portion 15b' of the another second elastic part 15'. Therefore, the second elastic part 15 can not only be connected to the central part 13 and the peripheral part 12, but also have an appropriate length in a limited space. When the second elastic part 15 has a certain length, the second elastic part 15 can have an appropriate stiffness along the axial direction Z, such that the central part 13 can produce a preferred high-frequency vibration.

In addition, an extension direction of the first outer connection portion 14a and an extension direction of the second outer connection portion 15a is parallel to each other. An extension direction of the first inner connection portion 14b and an extension direction of the second inner connection portion 15b is parallel to each other. These arrangements apply to the rest first elastic parts 14 and 14' and the rest second elastic parts 15 and 15'.

Referring to FIGS. 3 and 6, FIG. 6 is a partial top view of the microelectromechanical apparatus in FIG. 2.

As shown in FIGS. 3 and 6, in the location of each first elastic part 14, the first electrode 141 is disposed on the first piezoelectric material layer 341. Also, in the location of each second elastic part 15, the second electrode 151 is disposed on the second piezoelectric material layer 342.

Please refer back to FIGS. 2 and 3. The first electrically conductive line 142 is disposed on the piezoelectric material layer 34 of the stationary part 11. The first electrically conductive line 142 extends in a way of surrounding the first elastic parts 14, and the first electrically conductive line 142 has a plurality of branches respectively and electrically connected to the first electrodes 141. When an electrical signal is applied to the first electrically conductive line 142, the electrical signal may be simultaneously applied to the first electrode 141. When the electrical signal passes through the first electrode 141 and the common electrode layer 33, the first piezoelectric material layer 341 of the first elastic part 14 is deformed according to the electrical signal.

The second electrically conductive line 152 is disposed on one of the first piezoelectric material layer 341 of one of the first elastic parts 14 and the piezoelectric material layer 34 of the peripheral part 12. The second electrically conductive line 152 further extends in a way of surrounding the second elastic parts 15. The second electrically conductive line 152 has a plurality of branches respectively and electrically connected to the second electrodes 151. When an electrical signal is applied to the second electrically conductive line 152, the electrical signal is simultaneously applied to the second electrode 151. When the electrical signal passes through the second electrode 151 and the common electrode layer 33, the second piezoelectric material layer 342 of the second elastic part 15 can be deformed according to the electrical signal.

The manufacturing processes of the microelectromechanical apparatus 1 are given below. Referring to FIGS. 2 to 3 and 7 to 10, where FIGS. 7 to 10 are lateral cross-sectional views showing the manufacturing process of the microelectromechanical apparatus in FIG. 3.

Figure 7:
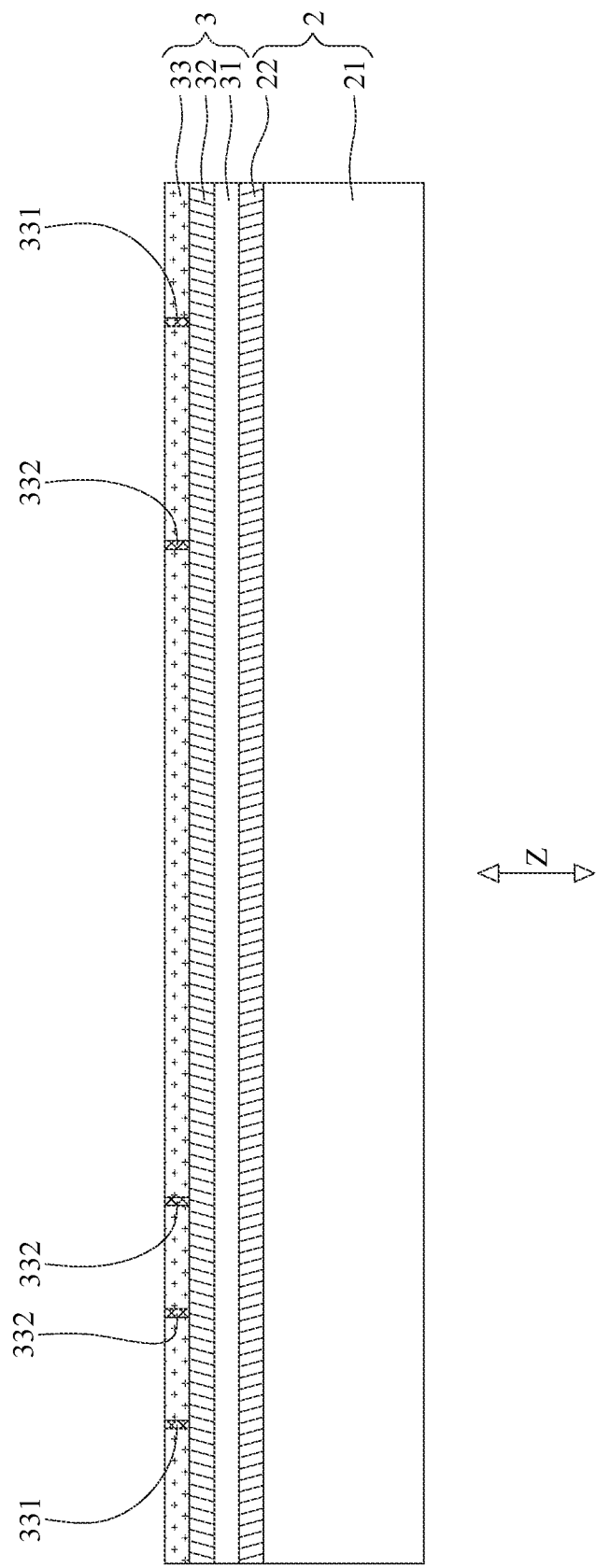
FIGS. 7 to 10 are lateral cross-sectional views showing the manufacturing process of the microelectromechanical apparatus in FIG. 3.

As shown in FIG. 7, the base layer 21 and the insulation layer 22 are configured to form the base 2 of FIG. 3. The base layer 31, the insulation layer 32, and the common electrode layer 33 are configured to form the thin film 3 of FIG. 3. In the thin film 3, the first insulation line 331 and the second insulation line 332 are formed to disposed through the common electrode layer 33 along the axial direction Z.

Figure 8:
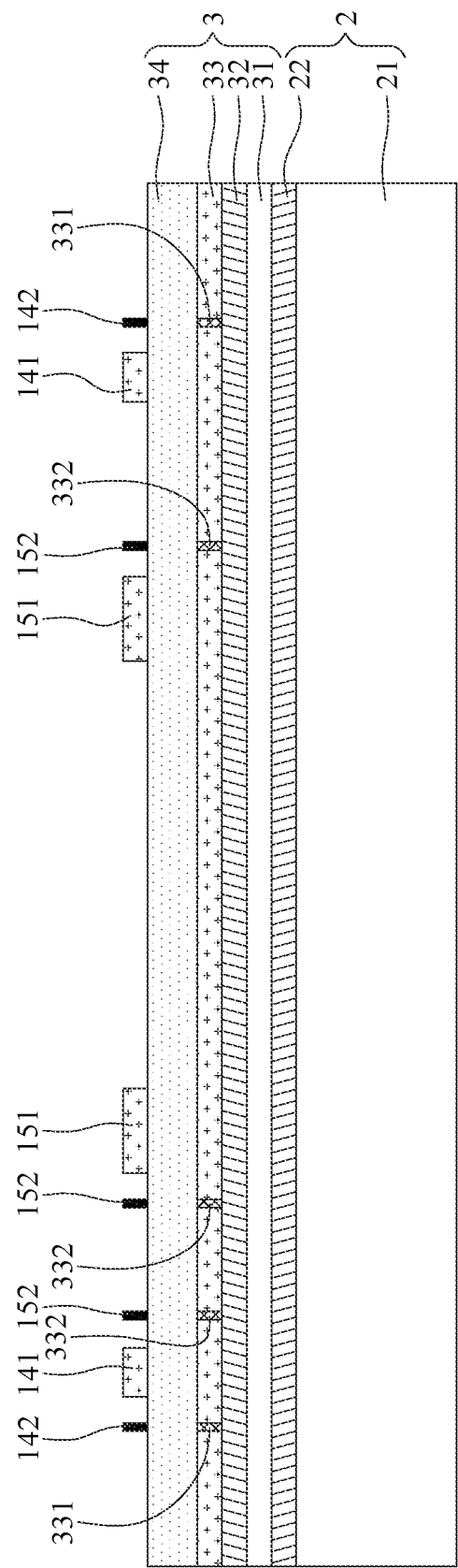

As shown in FIG. 8, the piezoelectric material layer 34 is formed on the common electrode layer 33. The first electrode 141, the second electrode 151, the first electrically conductive line 142, and the second electrically conductive line 152 are formed on the piezoelectric material layer 34.

Figure 9:
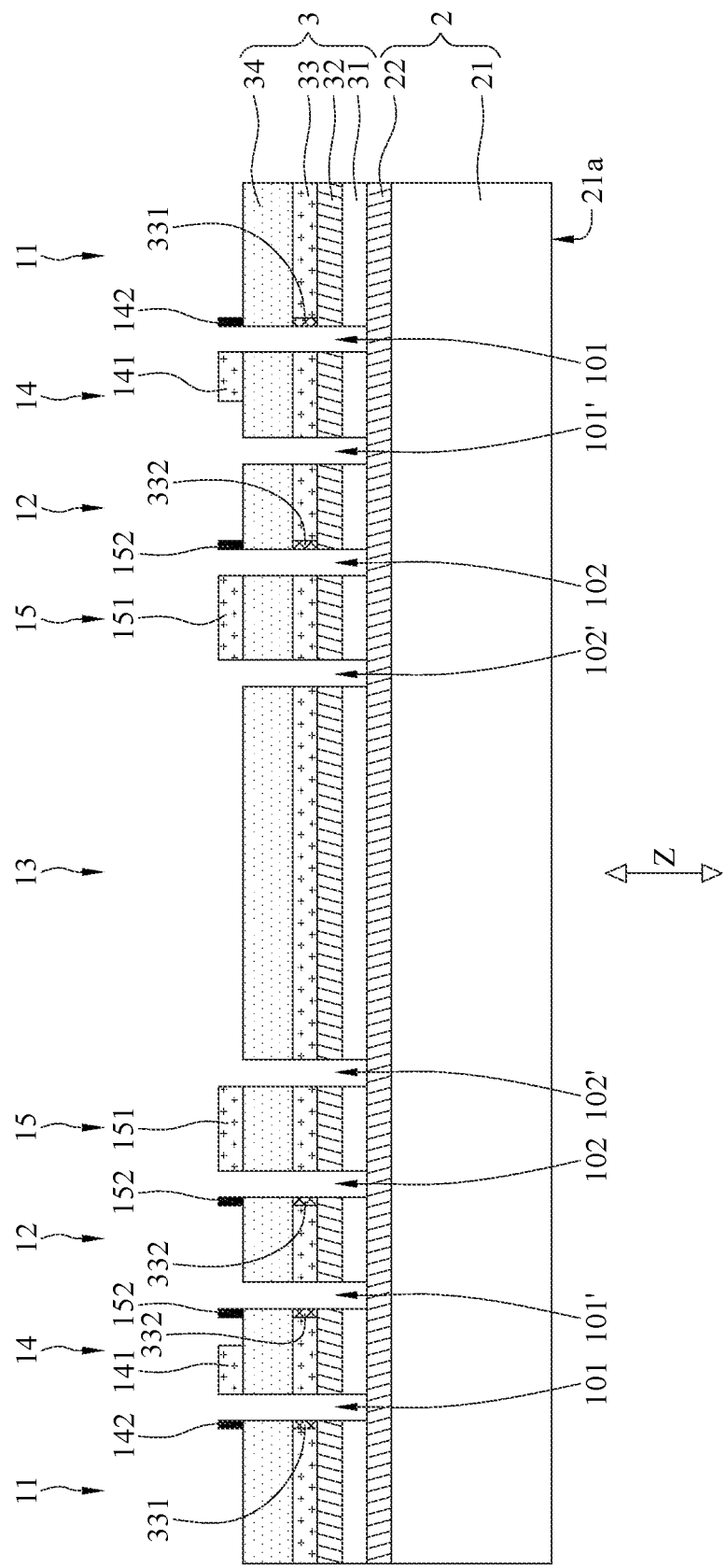

As shown in FIG. 9, the first slots 101, the first slots 101', the second slots 102, and the second slots 102' are formed along a direction from the piezoelectric material layer 34 towards the base 2 so as to penetrate through the piezoelectric material layer 34, the common electrode layer 33, the insulation layer 32, and the base layer 31. As shown in FIGS. 2 and 9, the first slots 101 and 101' and the second slots 102 and 102' separate the stationary part 11, the peripheral part 12, the central part 13, the four first elastic parts 14 and the four second elastic parts 15 from one another. In this embodiment, the quantity of the first elastic parts 14 is four and the quantity of the second elastic parts 15 is four as well, but the present disclosure is not limited thereto.

Figure 10:
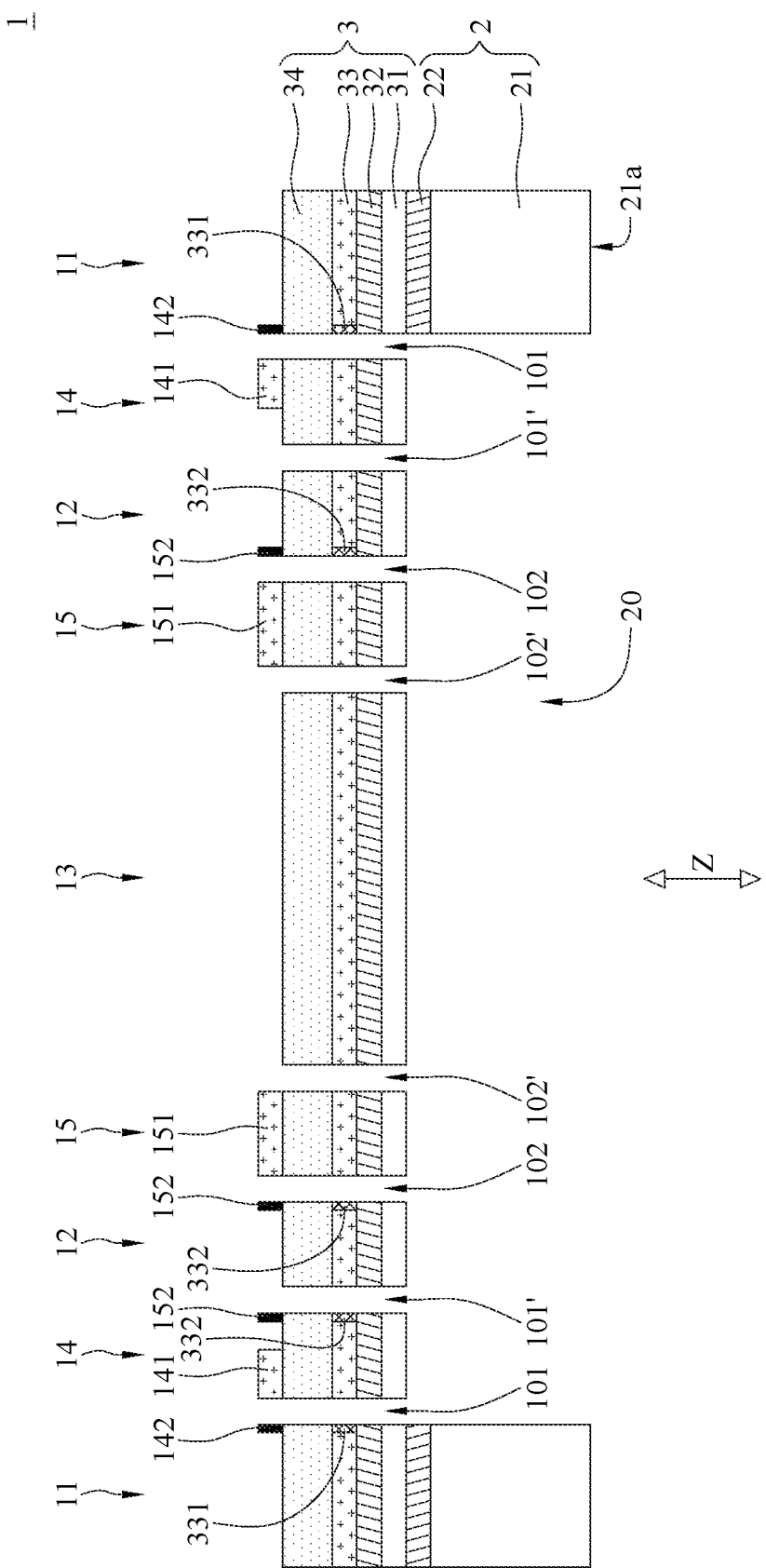

Then, as shown in FIG. 10, the cavity 20 is formed at a bottom surface 21a of the base layer 21. The cavity 20 penetrates through the base layer 21 and the insulation layer 22 and communicate with the first slots 101, the first slots 101', the second slots 102, and the second slots 102', thereby obtaining the base 2.

Figure 12:
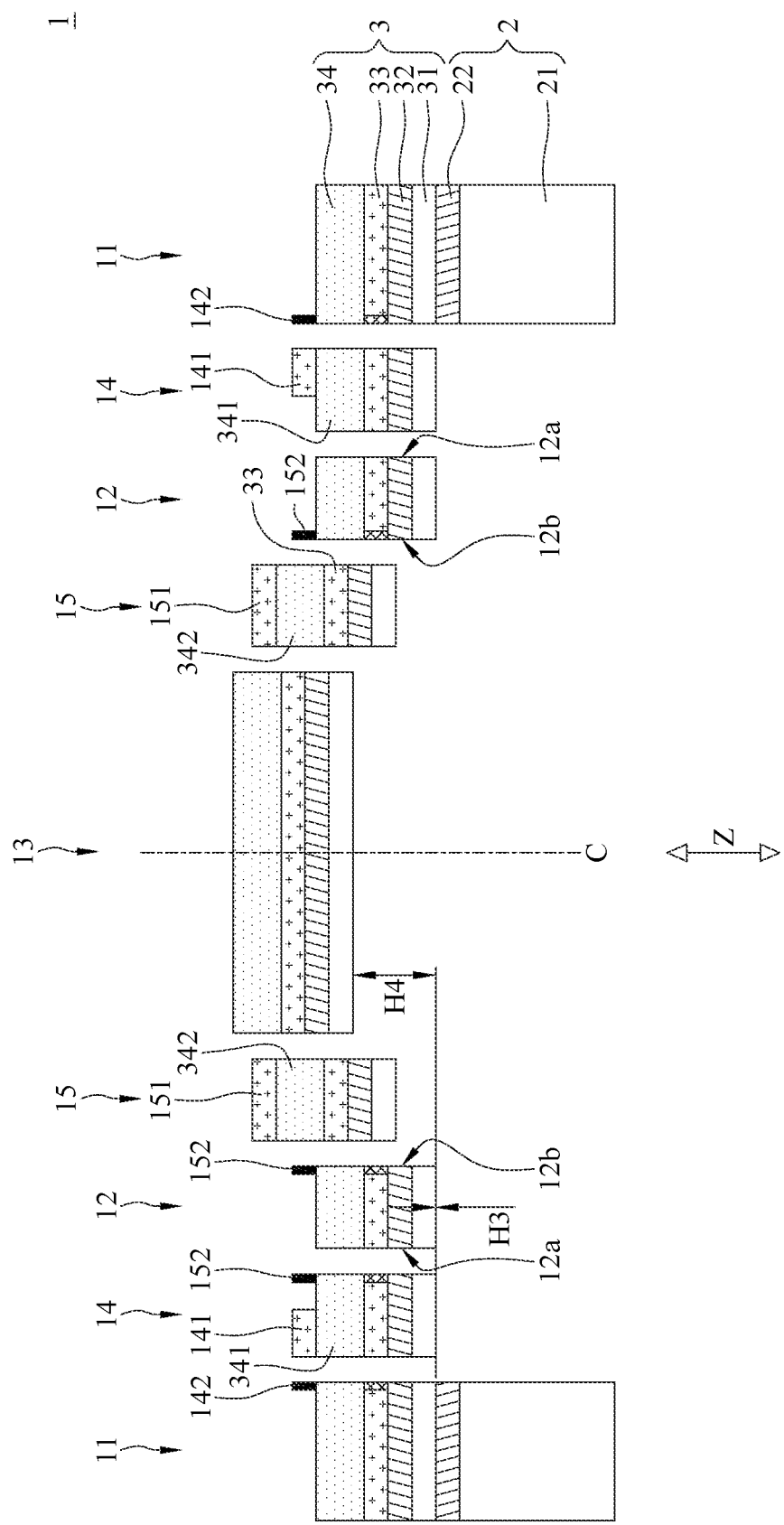

The operation of the microelectromechanical apparatus 1 is given below with reference to FIGS. 3, 11, and 12, where FIGS. 11 and 12 are lateral cross-sectional views showing the operation of the microelectromechanical apparatus in FIG. 3.

As shown in FIG. 11, when the low frequency electrical driving signal (e.g., low frequency voltage driving signal) is input to the first electrode 141, and a reference voltage is input to the common electrode layer 33, the first electrode 141 drives the first piezoelectric material layer 341 of the first elastic part 14 to deform so as to force the peripheral part 12 to vibrate with the first low-frequency amplitude H1 along the axial direction Z. When the peripheral part 12 vibrates at the first low-frequency amplitude H1 along the axial direction Z, the central part 13 is moved by the second elastic part 15 so that the central part 13 is forced to vibrate with the second low-frequency amplitude H2 along the axial direction Z. Since the stiffness of the first elastic part 14 along the axial direction Z is smaller than the stiffness of the second elastic part 15 along the axial direction Z, a first main resonance frequency ($f_{1N1}$) of the peripheral part 12 is smaller than a second main resonance frequency ($f_{2N1}$) of the central part 13. When the peripheral part 12 vibrates along the axial direction Z at a vibration frequency lower than the first main resonance frequency ($f_{1N1}$), the central part 13 also vibrates at a low frequency. In order to reduce the difference between the second low-frequency amplitude of the central part 13 vibrating at the low frequency and the first low-frequency amplitude of the peripheral part 12 vibrating at the low frequency, the second main resonance frequency ($f_{2N1}$) of the central part 13 is far away from the first main resonance frequency ($f_{1N1}$) of the peripheral part 12. That is, the second main resonance frequency ($f_{2N1}$) of the central part 13 and the first main resonance frequency ($f_{1N1}$) of the peripheral part 12 have a significant difference therebetween. In this embodiment, a frequency ratio of the second main resonance frequency ($f_{2N1}$) of the central part 13 to the first main resonance frequency ($f_{1N1}$) of the peripheral part 12 may be greater than a predetermined frequency ratio. In this embodiment, the predetermined frequency ratio is, for example, greater than or equal to 2.0. In this case, the difference between the first low-frequency amplitude H1 of the peripheral part 12 and the second low-frequency amplitude H2 of the central part 13 is smaller than the low-frequency amplitude predetermined value. In this embodiment, the first low-frequency amplitude H1 may be 7.73 μm, and the second low-frequency amplitude H2 may be 8.56 μm. In this case, the difference between the first low-frequency amplitude H1 and the second low-frequency amplitude H2 is 0.83 μm and smaller than a low-frequency amplitude predetermined value. For example, in this embodiment, the low-frequency amplitude predetermined value may be 1.0 μm. In another embodiment, a preferred low-frequency amplitude predetermined value may be selected from a specific range (e.g., between 0 μm and 1.0 μm) as required. In other words, there is a small difference between the first low-frequency amplitude H1 and the second low-frequency amplitude H2. In this situation, the central part 13 and the peripheral part 12 can be considered as a single body vibrating at low frequency. Therefore, the thin film 3 obtains a large effective area to perform low-frequency vibration, thereby enhancing a sound pressure level of low-frequency sound.

As shown in FIG. 12, there is no electrical signal input to the first electrode 141, such that the peripheral part 12 is nearly stationary. In this situation, a first high-frequency amplitude H3 of the peripheral part 12 along the axial direction Z is nearly 0. When a high-frequency driving signal (e.g., high-frequency voltage driving signal) is input to the second electrode 151, and a reference voltage is input to the common electrode layer 33, the second electrode 151 causes the second piezoelectric material layer 342 of the second elastic part 15 to deform so as to force the central part 13 to vibrate with a second high-frequency amplitude H4 along the axial direction Z. In this moment, the central part 13 moves the peripheral part 12 via the second elastic part 15 along the axial direction Z and vibrates with the second high-frequency amplitude H4. Since the stiffness of the second elastic part 15 along the axial direction Z is greater than the stiffness of the first elastic part 14 along the axial direction Z, the second main resonance frequency ($f_{2N1}$) of the central part 13 is greater than the first main resonance frequency ($f_{1N1}$) of the peripheral part 12. Therefore, when the central part 13 vibrates along the axial direction Z at a vibration frequency approximate to the second main resonance frequency ($f_{2N1}$), the second high-frequency amplitude H4 of the central part 13 along the axial direction Z is greater than the first high-frequency amplitude H3 of the peripheral part 12 along the axial direction Z. At this moment, the difference between the first high-frequency amplitude H3 and the second high-frequency amplitude H4 is approximate to the value of the second high-frequency amplitude H4. In other words, the difference between the first high-frequency amplitude H3 and the second high-frequency amplitude H4 is greater than a predetermined high-frequency amplitude value. In one embodiment, the first high-frequency amplitude H3 may be 3.47 μm, and the second high-frequency amplitude H4 may be 7.28 μm. In this case, the difference between the first high-frequency amplitude H3 and the second high-frequency amplitude H4 is 3.81 μm and larger than a predetermined high-frequency amplitude value. For example, in this embodiment, the predetermined high-frequency amplitude value may be 3.0 μm. In another embodiment, a predetermined preferred high-frequency amplitude value may be selected from a specific range (e.g., between 3.0 μm and 10.0 μm) as required. In this satiation, the area of the central part 13 can be considered as an effective area that the thin film 3 vibrates at high frequency. Since the central part 13 vibrates at the higher vibration frequency, the thin film 3 has the sufficient effective area to provide a high-frequency sound with a sufficient sound pressure level without the help of the peripheral part 12.

Comparing the previous paragraph with FIGS. 11 and 12, the difference (e.g., 0.83 μm) between the first low-frequency amplitude H1 and the second low-frequency amplitude H2 is smaller than the difference (e.g., 3.81 μm) between the first high-frequency amplitude H3 and the second high-frequency amplitude H4. Therefore, whether the thin film 3 vibrates at low frequency or at high frequency, the thin film 3 has an effective area sufficient to produce with a required sound pressure level.

The peripheral part 12 has the first main resonance frequency ($f_{1N1}$). The central part 13 has the second main resonance frequency ($f_{2N1}$). The first main resonance frequency ($f_{1N1}$) is smaller than the second main resonance frequency ($f_{2N1}$). When there is an electrical signal applied to the first electrode 141 and the common electrode layer 33 to force the peripheral part 12 and the central part 13 to vibrate simultaneously at a low frequency, the frequency of such vibration may be approximate to the first main resonance frequency ($f_{1N1}$), such that the vibrating amplitude of the peripheral part 12 and the vibrating amplitude of the central part 13 are approximate to the vibrating amplitude of the peripheral part 12 during resonant vibration. Therefore, when an electrical signal is applied to the first electrode 141 and the common electrode layer 33, it can drive the peripheral part 12 and the central part 13 to vibrate at a low-frequency with sufficient vibrating amplitude without the need of large amount of electrical power.

When there is an electrical signal is applied to the second electrode 151 and the common electrode layer 33 to force the central part 13 to vibrate at high frequency, the frequency of the vibration can approximate the second main resonance frequency ($f_{2N1}$), and thus the central part 13 vibrates at resonance frequency. Therefore, when an electrical signal is applied to the second electrode 151 and the common electrode layer 33, it can drive the central part 13 to vibrate at a high-frequency vibration with sufficient vibrating amplitude without the need of large amount of electrical power.

On the other hand, the peripheral part 12 has at least one first sub-resonance frequency ($f_{1N2}$, $f_{1N3}$ . . . ), the first sub-resonance frequency means the resonance frequency of the peripheral part 12 other than the first main resonance frequency ($f_{1N1}$). The difference between the first sub-resonance frequency and the first main resonance frequency ($f_{1N1}$) is smaller than the difference between the first sub-resonance frequency and the second main resonance frequency ($f_{2N1}$). In other words, the first sub-resonance frequency is approximate to the first main resonance frequency ($f_{1N1}$) but not approximate to the second main resonance frequency ($f_{2N1}$). Therefore, when the central part 13 vibrates at high frequency, the first high-frequency amplitude H3 of the peripheral part 12 may be not too large. Accordingly, high-frequency sound pressure produced by the central part 13 is prevented from being interfered by the sound pressure of low-frequency sound. In another embodiment, when the distance between the peripheral part 12 and the center C of the central part 13 is increased, the difference between the first sub-resonance frequency and the first main resonance frequency ($f_{1N1}$) may be reduced. In other words, when the distance between an outer edge 12a or an inner edge 12b of the peripheral part 12 and the center C of the central part 13 is increased, the difference between the first sub-resonance frequency and the second main resonance frequency ($f_{2N1}$) may be increased.

Figure 13:
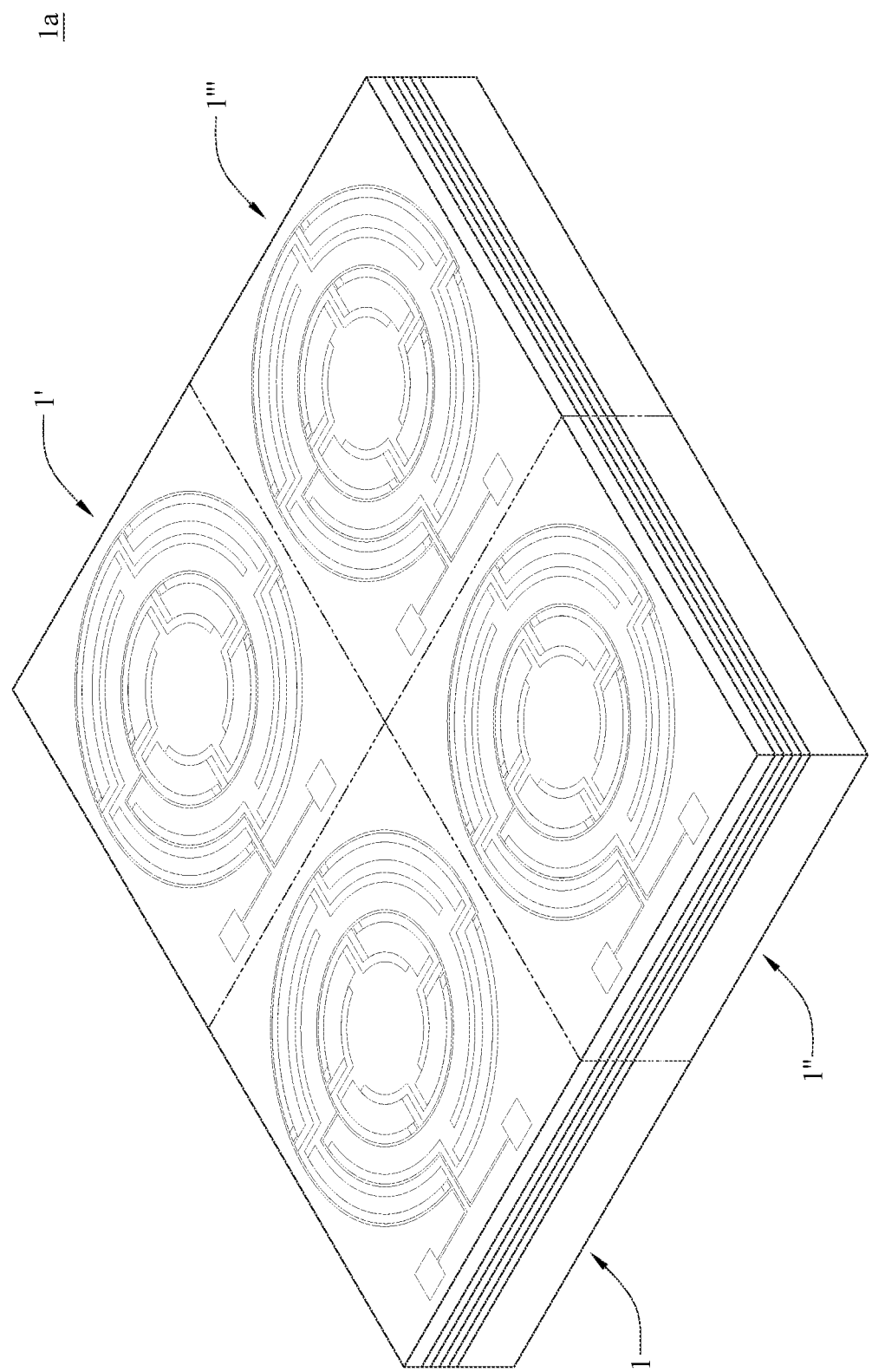
FIG. 13 is a perspective view of a microelectromechanical apparatus assembly according to another embodiment of the disclosure.

Referring to FIG. 13, where FIG. 13 is a perspective view of a microelectromechanical apparatus assembly according to another embodiment of the disclosure. In this embodiment, the microelectromechanical apparatus assembly 1a includes a microelectromechanical apparatus 1, a microelectromechanical apparatus 1', a microelectromechanical apparatus 1", and a microelectromechanical apparatus 1'". The first main resonance frequencies ($f_{1N1}$) and the second main resonance frequencies ($f_{2N1}$) of the microelectromechanical apparatus 1, 1', 1", and 1'" may be different from one another. The microelectromechanical apparatus assembly 1a can applied in a wider frequency range.

Figure 14:
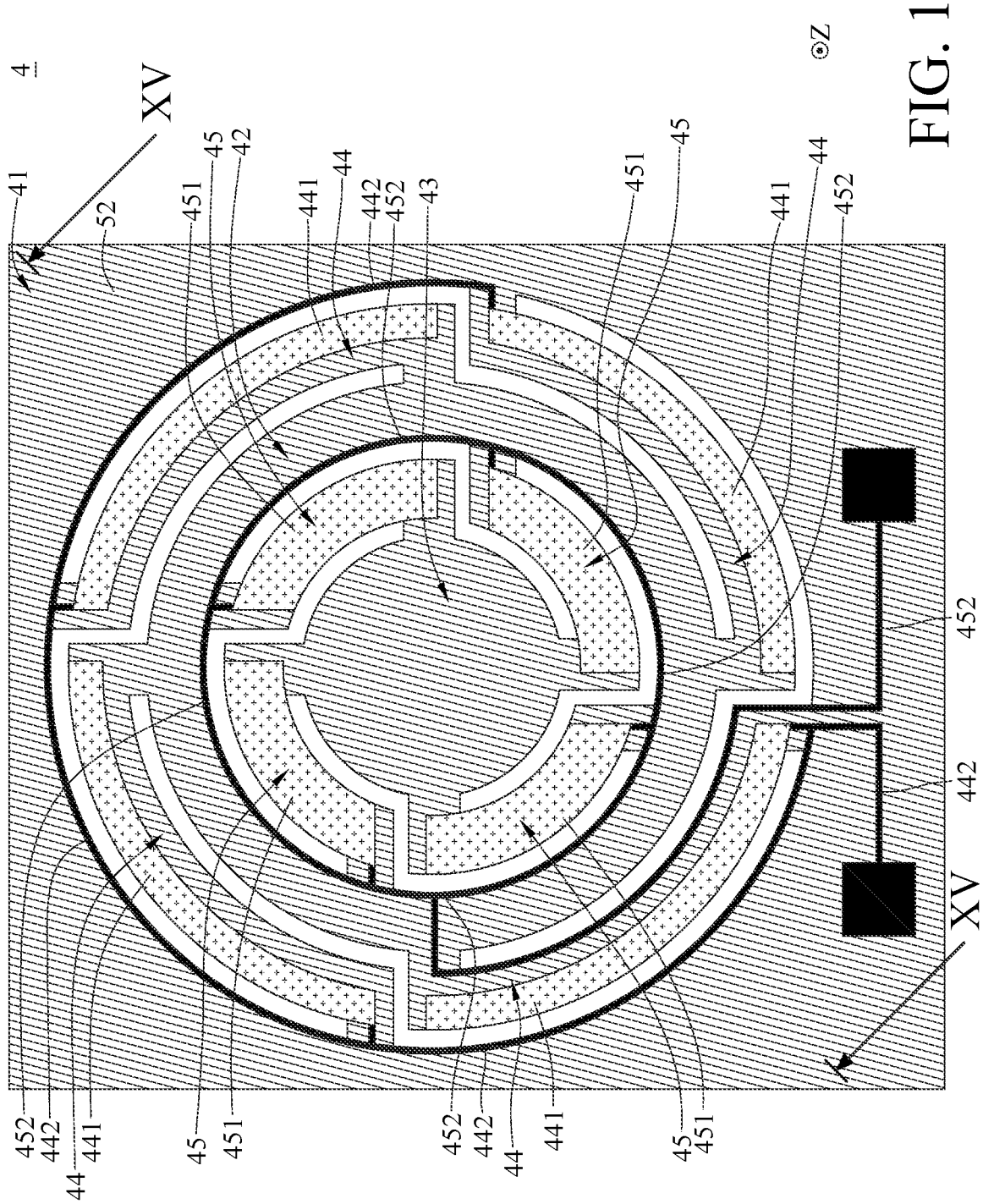
FIG. 14 is a top view of a microelectromechanical apparatus having multiple vibrating portions according to still another embodiment of the disclosure.
Figure 15:
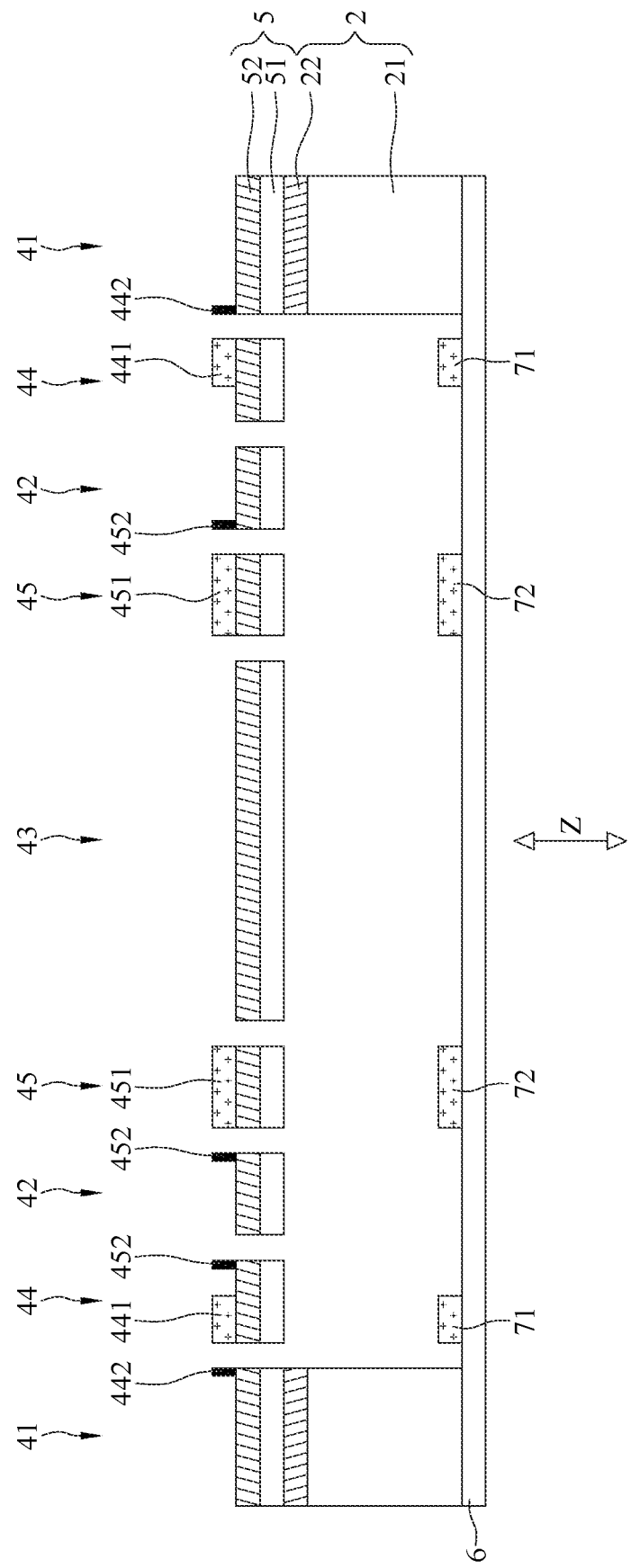
FIG. 15 is a lateral cross-sectional view of the microelectromechanical apparatus in FIG. 14 taken along a line XV-XV.

Referring to FIGS. 14 and 15, where FIG. 14 is a top view of a microelectromechanical apparatus having multiple vibrating portions according to still another embodiment of the disclosure, and FIG. 15 is a lateral cross-sectional view of the microelectromechanical apparatus in FIG. 14 taken along a line XV-XV.

As shown in FIG. 14 and FIG. 15, the microelectromechanical apparatus 4 include a base 2, a thin film 5, a first electrically conductive line 442, a second electrically conductive line 452, and a substrate 6. The base 2 is similar to the base 2 of the microelectromechanical apparatus 1 shown in FIG. 2, and thus the introduction of the base 2 will be omitted hereinafter. As shown in FIG. 15, the thin film 5 include a stationary part 41, a peripheral part 42, a central part 43, a plurality of first elastic parts 44, and a plurality of second elastic parts 45.

The stationary part 41 is disposed on the base 2. The stationary part 41 surrounds the peripheral part 42. The first elastic parts 44 are connected to the stationary part 41 and the peripheral part 42. The peripheral part 42 surrounds the central part 43. The second elastic parts 45 are connected to the peripheral part 42 and the central part 43. A stiffness of each first elastic part 44 along the axial direction Z is smaller than a stiffness of each second elastic part 45 along the axial direction Z.

The stationary part 41, the peripheral part 42, the central part 43, each first elastic part 44, and each second elastic part 45 each include a base layer 51 and an insulation layer 52 stacked on the base layer 51 (as shown in FIG. 15). Each of the first elastic parts 44 further includes a first electrode 441 disposed on the insulation layer 52. The first electrically conductive line 442 is disposed on the insulation layer 52 of the stationary part 41. The first electrically conductive line 442 is electrically connected to the first electrode 441 (as shown in FIG. 14).

Each of the second elastic parts 45 further includes a second electrode 451 disposed on the insulation layer 52. The second electrically conductive line 452 is disposed on the insulation layer 52 of one of the first elastic parts 44 and the insulation layer 52 of the peripheral part 42. The second electrically conductive line 452 is electrically connected to the second electrode 451.

As shown in FIG. 15, the base 2 is disposed on the substrate 6. The substrate 6 has a plurality of first stationary electrodes 71 and a plurality of second stationary electrodes 72. Projections of the first electrodes 441 onto the substrate 6 along the axial direction Z and projections of the first stationary electrodes 71 onto the substrate 6 along the axial direction Z are respectively overlapped with each other. The first elastic parts 44 are respectively located above the first stationary electrodes 71. Projections of the second electrodes 451 onto the substrate 6 along the axial direction Z and projections of the second stationary electrodes 72 onto the substrate 6 along the axial direction Z are respectively overlapped with each other. The second elastic parts 45 are respectively located above the second stationary electrodes 72.

Figure 16:
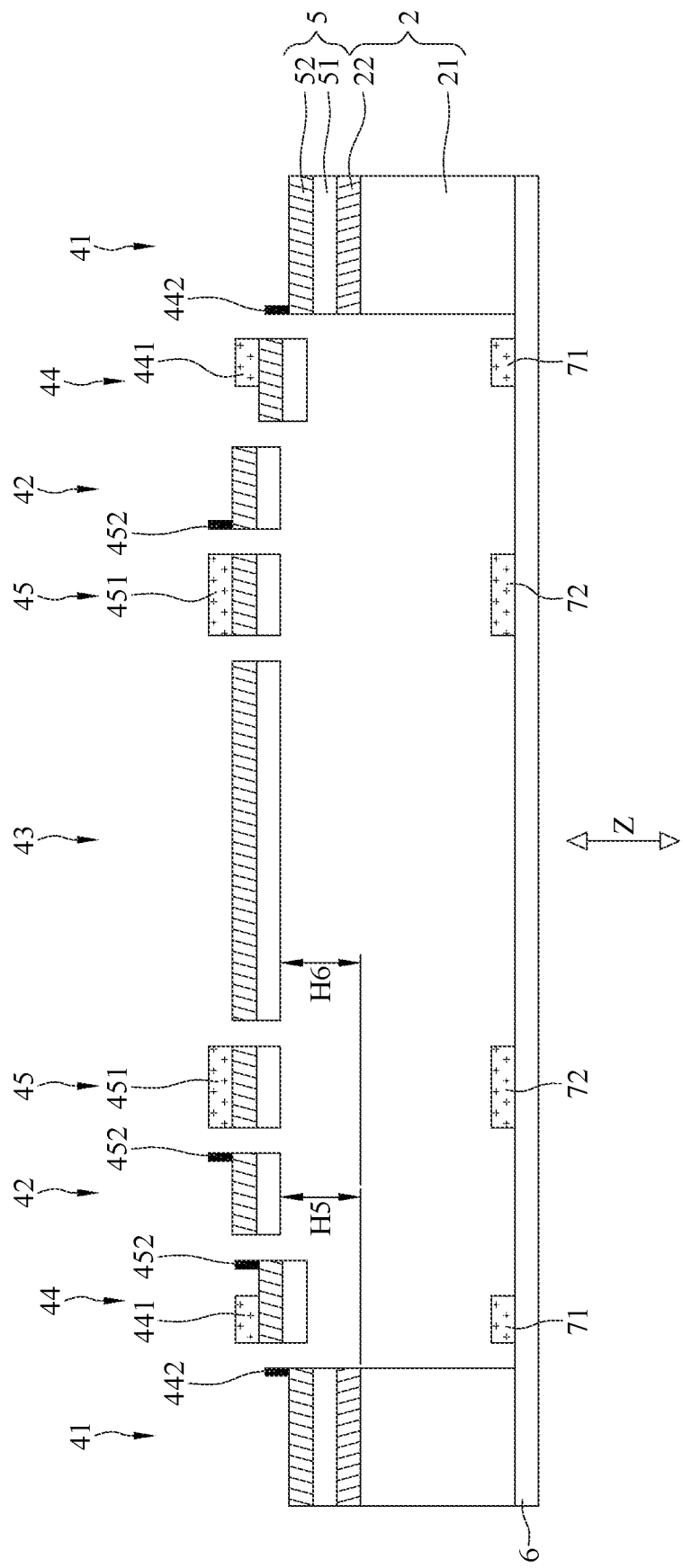
FIGS. 16 and 17 are lateral cross-sectional views showing the operation of the microelectromechanical apparatus in FIG. 13.
Figure 17:
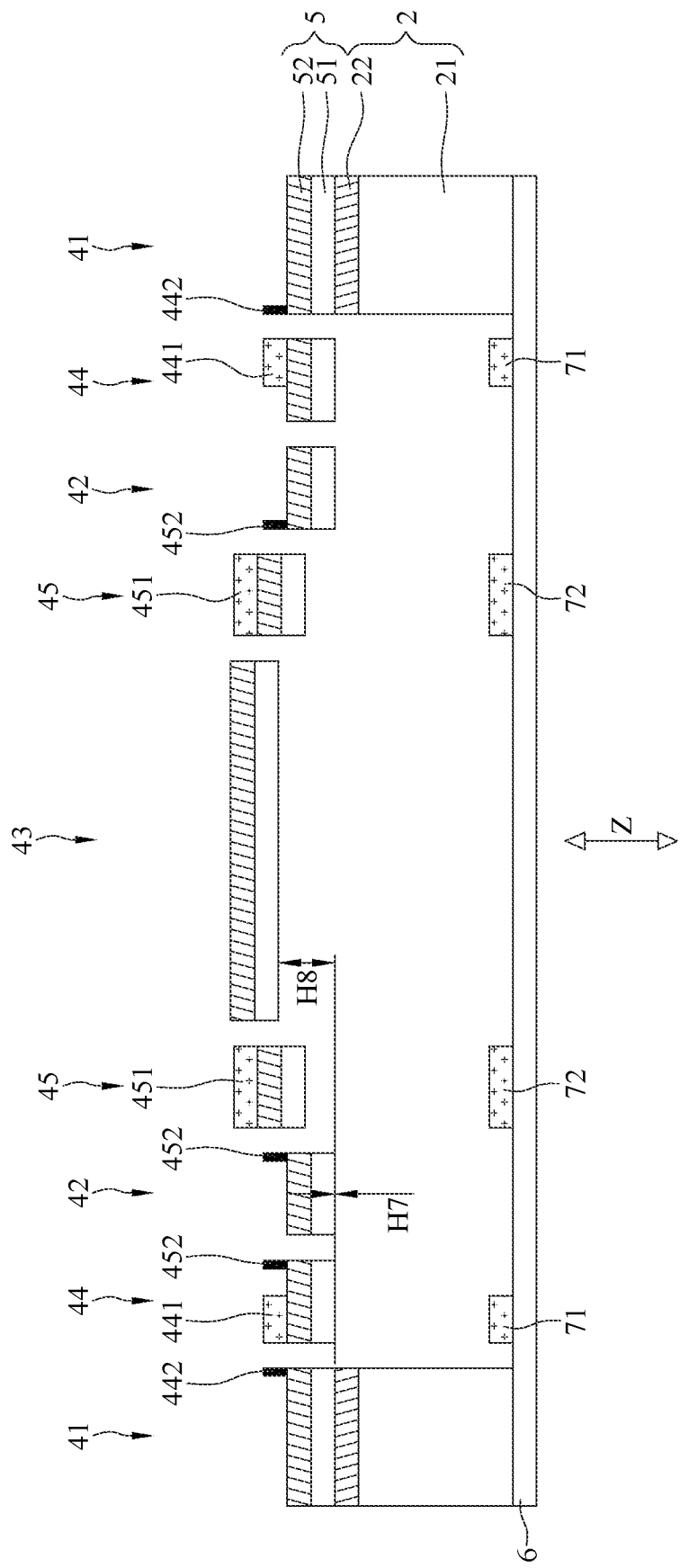

The following paragraphs will introduce the operation of the microelectromechanical apparatus 4. Referring to FIGS. 15 to 17, where FIGS. 16 and 17 are lateral cross-sectional views showing the operation of the microelectromechanical apparatus in FIG. 13.

As shown in FIG. 16, when a low frequency electrical driving signal is input to the first electrode 441 and the first stationary electrode 71, the first electrode 441 and the first stationary electrode 71 produce an electrostatic force, such that the peripheral part 42 vibrates with a first low-frequency amplitude H5 along the axial direction Z. Since the stiffness of the second elastic part 45 along the axial direction Z is greater than the stiffness of the first elastic part 44 along the axial direction Z, the peripheral part 42 can drive the central part 43 to vibrate via the second elastic part 45, such that the central part 43 vibrates with a second low-frequency amplitude H6 along the axial direction Z. Therefore, when the low frequency electrical driving signal is input to the first electrode 441 and the first stationary electrode 71, the peripheral part 42 and the central part 43 both vibrate at low frequency along the axial direction Z. Since the stiffness of the second elastic part 45 along the axial direction Z is greater than the stiffness of the first elastic part 44 along the axial direction Z, the difference between the first low-frequency amplitude H5 and the second low-frequency amplitude H6 is small.

As shown in FIG. 17, there is no electrical signal input to the first electrode 441 and the first stationary electrode 71, such that the peripheral part 42 is nearly stationary. At this moment, a first high-frequency amplitude H7 of the peripheral part 42 along the axial direction Z is approximately 0. When a high-frequency driving signal is input to the second electrode 451 and the second stationary electrode 72, the second electrode 451 and the second stationary electrode 72 produce another electrostatic force, such that the central part 43 vibrates with a second high-frequency amplitude H8 along the axial direction Z. Although the central part 43 can drive the peripheral part 42 to move via the second elastic part 45, the first high-frequency amplitude H7 of the peripheral part 42 along the axial direction Z is very small. On the other hand, since the stiffness of the second elastic part 45 along the axial direction Z is greater than the stiffness of the first elastic part 44 along the axial direction Z, and the high-frequency driving signal drives the central part 43 to vibrate at a high-frequency of a second main resonance frequency ($f_{2N1}$), the first high-frequency amplitude H7 is smaller than the second high-frequency amplitude H8. On the other hand, when the high-frequency driving signal is input to the second electrode 451 and the second stationary electrode 72, the difference between the first high-frequency amplitude H7 and the second high-frequency amplitude H8 is approximately equal to the value of the second high-frequency amplitude H8.

According to the aforementioned discussion and compared FIGS. 16 with 17, the difference between the first low-frequency amplitude H5 and the second low-frequency amplitude H6 is smaller than the difference between the first high-frequency amplitude H7 and the second high-frequency amplitude H8.

Figure 18:
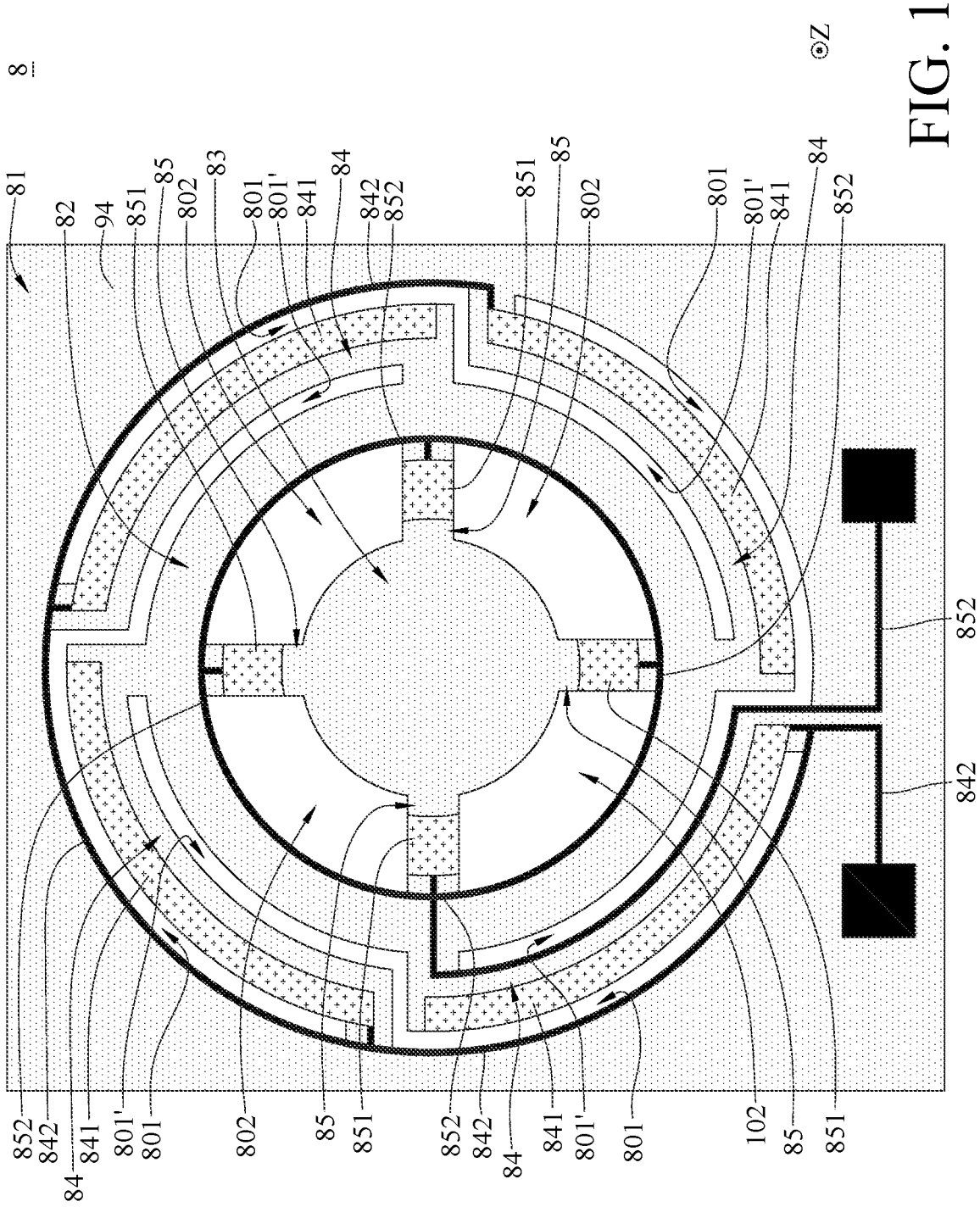
FIG. 18 is a top view of a microelectromechanical apparatus having multiple vibrating portions according to yet another embodiment of the disclosure.

Referring to FIG. 18, where FIG. 18 is a top view of a microelectromechanical apparatus having multiple vibrating portions according to yet another embodiment of the disclosure. The microelectromechanical apparatus 8 shown in FIG. 18 is similar to the microelectromechanical apparatus 1 shown in FIGS. 2 and 3, and thus the following paragraphs will omit the same or similar part between them hereinafter.

As shown in FIG. 18, the microelectromechanical apparatus 8 having multiple vibrating portions includes a thin film, a first electrically conductive line 842, and a second electrically conductive line 852. The thin film includes a stationary part 81, a peripheral part 82, a central part 83, a plurality of first elastic parts 84, and a plurality of second elastic parts 85. In this embodiment, the quantity of the first elastic parts 84 and the quantity of the second elastic parts 85 are four, but the present disclosure is not limited thereto.

The stationary part 81 surrounds the peripheral part 82. First slots 801, the first elastic parts 84, and first slots 801' are located between the stationary part 81 and the peripheral part 82. The stationary part 81 and partial part of each of the first elastic parts 84 are separated from each other by the first slot 801. The peripheral part 82 and partial part of each of the first elastic parts 84 are separated from each other by the another first slot 801'. Part of each of the first elastic parts 84 are located between the first slot 801 and the another first slot 801' while each of the first elastic parts 84 is connected to the stationary part 81 and the peripheral part 82. The peripheral part 82 surrounds the central part 83. The peripheral part 82 and the central part 83 are separated from each other by second slots 802. Each of the second elastic parts 85 is located between the peripheral part 82 and the central part 83 and connected to the peripheral part 82 and the central part 83 with a minimum distance. Therefore, a stiffness of each of the second elastic parts 85 along an axial direction Z is greater than a stiffness of each of the first elastic parts 84 along the axial direction Z. In other words, the stiffness of each of the first elastic parts 84 along the axial direction Z is smaller than the stiffness of each of the second elastic parts 85 along the axial direction Z.

Each of the first elastic parts 84 further includes a first electrode 841 disposed on the piezoelectric material layer 94. Each of the second elastic parts 85 further includes a second electrode 851 disposed on the piezoelectric material layer 94. The first electrically conductive line 842 is disposed on the piezoelectric material layer 94 of the stationary part 11. The second electrically conductive line 852 is disposed on the piezoelectric material layer 94 of one of the first elastic parts 84 and the piezoelectric material layer 94 of the peripheral part 12.

According to the microelectromechanical apparatuses as discussed in the above embodiments, the difference between the first low-frequency amplitude and the second low-frequency amplitude is smaller than the difference between the first high-frequency amplitude and the second high-frequency amplitude, such that the peripheral part and the central part are able to vibrate at low frequency, and the central part is able to vibrate at high frequency. As such, the microelectromechanical apparatus is able to provide sufficient sound pressure whether it performs low-frequency or high-frequency vibration, such that the requirements responsive to high-frequency and low-frequency sound can be simultaneously satisfied. In addition, the first electrode and the second electrode can respectively and directly apply electrical power on the first elastic part and the second elastic part to vibrate the peripheral part and the central part. Therefore, the power consumption can be reduced while the microelectromechanical produces a sound of the wide frequency range. It is possible to produce sound with a wider frequency range by adopting more than one of the aforementioned microelectromechanical apparatuses.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A microelectromechanical apparatus having multiple vibrating portions, comprising:
   a base; and
   a thin film, comprising:
      a stationary part, disposed on the base;
      a peripheral part;
      a central part, wherein the peripheral part surrounds the central part;
      at least one first elastic part, comprising at least one first electrode; and
      at least one second elastic part, comprising at least one second electrode;
   wherein the at least one first elastic part is connected to the stationary part and the peripheral part, and the at least one second elastic part is connected to the peripheral part and the central part;
   wherein when a low frequency electrical driving signal is input to the at least one first electrode, the peripheral part vibrates with a first low-frequency amplitude along an axial direction, and the central part vibrates with a second low-frequency amplitude along the axial direction, and wherein the axial direction is parallel to a normal vector of the base;
   wherein when a high-frequency electrical driving signal is input to the at least one second electrode, the peripheral part vibrates with a first high-frequency amplitude along the axial direction, and the central part vibrates with a second high-frequency amplitude along the axial direction;
   wherein a difference between the first low-frequency amplitude and the second low-frequency amplitude is smaller than a difference between the first high-frequency amplitude and the second high-frequency amplitude.

2. The microelectromechanical apparatus according to claim 1, wherein the difference between the first low-frequency amplitude and the second low-frequency amplitude is smaller than a low-frequency amplitude predetermined value, the difference between the first high-frequency amplitude and the second high-frequency amplitude is greater than a high-frequency amplitude predetermined value, the low-frequency amplitude predetermined value is smaller than or equal to 1.0 µm, and the high-frequency amplitude predetermined value is greater than or equal to 3.0 µm.

3. The microelectromechanical apparatus according to claim 1, wherein the at least one first elastic part further comprises at least one first piezoelectric material layer, the at least one first electrode drives the at least one first piezoelectric material layer for forcing the peripheral part to vibrate with the first low-frequency amplitude along the axial direction and forcing the central part to vibrate with the second low-frequency amplitude along the axial direction.

4. The microelectromechanical apparatus according to claim 1, wherein the at least one second elastic part further comprises at least one second piezoelectric material layer, the at least one second electrode drives the at least one second piezoelectric material layer for forcing the peripheral part to vibrate with the first high-frequency amplitude along the axial direction and forcing the central part to vibrate with the second high-frequency amplitude along the axial direction.

5. The microelectromechanical apparatus according to claim 1, further comprising a substrate, wherein the base is disposed on the substrate, and the substrate has at least one first stationary electrode and at least one second stationary electrode.

6. The microelectromechanical apparatus according to claim 5, wherein when the at least one first electrode and the at least one first stationary electrode produce an electrostatic force, the peripheral part vibrates with the first low-frequency amplitude along the axial direction, and the central part vibrates with the second low-frequency amplitude along the axial direction.

7. The microelectromechanical apparatus according to claim 5, wherein when the at least one second electrode and the at least one second stationary electrode produce another electrostatic force, the peripheral part vibrates with the first high-frequency amplitude along the axial direction, and the central part vibrates with the second high-frequency amplitude along the axial direction.

8. The microelectromechanical apparatus according to claim 1, wherein a stiffness of the at least one second elastic part along the axial direction is greater than a stiffness of the at least one first elastic part along the axial direction.

9. The microelectromechanical apparatus according to claim 8, wherein a stiffness ratio of the stiffness of the at least one second elastic part along the axial direction to the stiffness of the at least one first elastic part along the axial direction is greater than a predetermined stiffness ratio, and the predetermined stiffness ratio is greater than or equal to 3.0.

10. The microelectromechanical apparatus according to claim 8, wherein a length of the at least one first elastic part is greater than a length of the at least one second elastic part.

11. The microelectromechanical apparatus according to claim 8, wherein a thickness of the at least one first elastic part is smaller than a thickness of the at least one second elastic part.

12. The microelectromechanical apparatus according to claim 8, wherein a width of the at least one first elastic part is smaller than a width of the at least one second elastic part.

13. The microelectromechanical apparatus according to claim 8, wherein the quantity of the at least one first elastic part is smaller than the quantity of the at least one second elastic part.

14. The microelectromechanical apparatus according to claim 8, wherein the at least one first elastic part further comprises a first outer connection portion and a first inner connection portion, the at least one first elastic part surrounds the peripheral part, the first outer connection portion is connected to the stationary part, and the first inner connection portion is connected to the peripheral part.

15. The microelectromechanical apparatus according to claim 14, wherein the at least one second elastic part further comprises a second outer connection portion and a second inner connection portion, the at least one second elastic part surrounds the central part, the second outer connection portion is connected to the peripheral part, and the second inner connection portion is connected to the central part.

16. The microelectromechanical apparatus according to claim 15, wherein the at least one second elastic part comprises a plurality of second elastic parts, a minimum distance from the second outer connection portion of one of the plurality of second elastic parts to the second inner connection portion of another one of the plurality of second elastic parts is smaller than a distance from the second inner connection portion of the one of the plurality of second elastic parts to the second outer connection portion of the one of the plurality of second elastic parts.

17. The microelectromechanical apparatus according to claim 14, wherein the at least one first elastic part comprises a plurality of first elastic parts, a minimum distance from the first outer connection portion of one of the plurality of first elastic parts to the first inner connection portion of another one of the plurality of first elastic parts is smaller than a distance from the first inner connection portion of the one of the plurality of first elastic parts to the first outer connection portion of the one of the plurality of first elastic parts.

18. The microelectromechanical apparatus according to claim 1, wherein the peripheral part has a first main resonance frequency, the central part has a second main resonance frequency, and the first main resonance frequency is smaller than the second main resonance frequency.

19. The microelectromechanical apparatus according to claim 18, wherein a frequency ratio of the second main resonance frequency to the first main resonance frequency is greater than a predetermined frequency ratio, and the predetermined frequency ratio is greater than or equal to 2.0.

20. The microelectromechanical apparatus according to claim 18, wherein the peripheral part has at least one first sub-resonance frequency, a difference between the first sub-resonance frequency and the first main resonance frequency is smaller than a difference between the first sub-resonance frequency and the second main resonance frequency.

21. The microelectromechanical apparatus according to claim 1, further comprising a first electrically conductive line and a second electrically conductive line, wherein the first electrically conductive line is disposed on the thin film and electrically connected to the at least one first electrode, and the second electrically conductive line is disposed on the thin film and electrically connected to the at least one second electrode.

22. The microelectromechanical apparatus according to claim 21, wherein the thin film further comprises a first insulation line, a second insulation line, a common electrode layer, and a piezoelectric material layer disposed on the common electrode layer, the first insulation line is disposed at where the first electrically conductive line projects onto the common electrode layer, the first insulation line is disposed through the common electrode layer, a part of the piezoelectric material layer is located between the first electrically conductive line and the first insulation line, the second insulation line is disposed at where the second electrically conductive line projects onto the common electrode layer, the second electrically conductive line is disposed through the common electrode layer, a part of the piezoelectric material layer is located between the second electrically conductive line and the second insulation line.

23. The microelectromechanical apparatus according to claim 22, wherein the first electrically conductive line is disposed on the piezoelectric material layer of the stationary part, and a width of the first electrically conductive line is smaller than a width of the at least one first electrode.

24. The microelectromechanical apparatus according to claim 22, wherein the second electrically conductive line is disposed on the piezoelectric material layer of the at least one first elastic part and the piezoelectric material layer of the peripheral part, and a width of the second electrically conductive line is smaller than a width of the at least one second electrode.

25. A microelectromechanical apparatus having multiple vibrating portions, comprising:
a base; and
a thin film, comprising:
a stationary part, disposed on the base;
a peripheral part;
a central part, wherein the peripheral part surrounds the central part;
at least one first elastic part, comprising:
at least one first electrode;
at least one first piezoelectric material layer, wherein the at least one first electrode is electrically connected to the at least one first piezoelectric material layer;
a first outer connection portion; and
a first inner connection portion, wherein the at least one first elastic part surrounds the peripheral part, the first outer connection portion is connected to the stationary part, and the first inner connection portion is connected to the peripheral part; and
at least one second elastic part, comprising:
at least one second electrode;
at least one second piezoelectric material layer, wherein the at least one second electrode is electrically connected to the at least one second piezoelectric material layer;
a second outer connection portion; and
a second inner connection portion, wherein the at least one second elastic part surrounds the central part, the second outer connection portion is connected to the peripheral part, and the second inner connection portion is connected to the central part;
wherein when a low frequency electrical driving signal is input to the at least one first electrode, the peripheral part vibrates with a first low-frequency amplitude along an axial direction, and the central part vibrates with a second low-frequency amplitude along the axial direction, and wherein the axial direction is parallel to a normal vector of the base;
wherein when a high-frequency electrical driving signal is input to the at least one second electrode, the peripheral part vibrates with a first high-frequency amplitude along the axial direction, and the central part vibrates with a second high-frequency amplitude along the axial direction;
wherein a difference between the first low-frequency amplitude and the second low-frequency amplitude is smaller than a difference between the first high-frequency amplitude and the second high-frequency amplitude.

26. The microelectromechanical apparatus according to claim 25, wherein a stiffness of the at least one first elastic part along an axial direction is smaller than a stiffness of the at least one second elastic part along the axial direction.

27. The microelectromechanical apparatus according to claim 26, wherein a length of the at least one first elastic part is greater than a length of the at least one second elastic part.

28. The microelectromechanical apparatus according to claim 26, wherein a width of the at least one first elastic part is smaller than a width of the at least one second elastic part.

29. The microelectromechanical apparatus according to claim 26, wherein a thickness of the at least one first elastic part is smaller than a thickness of the at least one second elastic part.

30. The microelectromechanical apparatus according to claim 25, wherein the at least one first elastic part comprises a plurality of first elastic parts, a minimum distance from the first outer connection portion of one of the plurality of first elastic parts to the first inner connection portion of another one of the plurality of first elastic parts is smaller than a distance from the first inner connection portion of the one of the plurality of first elastic parts to the first outer connection portion of the one of the plurality of first elastic parts.

31. The microelectromechanical apparatus according to claim 25, wherein the at least one second elastic part comprises a plurality of second elastic parts, a minimum distance from the second outer connection portion of one of the plurality of second elastic parts to the second inner connection portion of another one of the plurality of second elastic parts is smaller than a distance from the second inner connection portion of the one of the plurality of second elastic parts to the second outer connection portion of the one of the plurality of second elastic parts.

32. The microelectromechanical apparatus according to claim 25, wherein an extension direction of the first outer connection portion and an extension direction of the second outer connection portion are parallel to each other, and an extension direction of the first inner connection portion and an extension direction of the second inner connection portion are parallel to each other.

* * * * *